(12) United States Patent
Lee et al.

(10) Patent No.: US 12,051,676 B2
(45) Date of Patent: Jul. 30, 2024

(54) LIGHTING MODULE AND LIGHTING ASSEMBLY INCLUDING SAME

(71) Applicant: LG INNOTEK CO., LTD., Seoul (KR)

(72) Inventors: Jung Ju Lee, Seoul (KR); Hoon Park, Seoul (KR); Sa Rum Han, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 714 days.

(21) Appl. No.: 17/270,911

(22) PCT Filed: Sep. 9, 2019

(86) PCT No.: PCT/KR2019/011655
§ 371 (c)(1),
(2) Date: Feb. 24, 2021

(87) PCT Pub. No.: WO2020/055070
PCT Pub. Date: Mar. 19, 2020

(65) Prior Publication Data
US 2021/0193635 A1    Jun. 24, 2021

(30) Foreign Application Priority Data

Sep. 11, 2018 (KR) .......................... 10-2018-0108489

(51) Int. Cl.
*H01L 25/075*   (2006.01)
*H01L 33/48*   (2010.01)
(Continued)

(52) U.S. Cl.
CPC ........ *H01L 25/0753* (2013.01); *H01L 33/483* (2013.01); *H01L 33/502* (2013.01);
(Continued)

(58) Field of Classification Search
CPC ... H01L 25/0753; H01L 33/483; H01L 33/50; H01L 33/501; H01L 33/502;
(Continued)

(56) References Cited

U.S. PATENT DOCUMENTS

| 6,680,568 B2 | 1/2004 | Fujiwara et al. |
| 6,949,772 B2 | 9/2005 | Shimizu et al. |

(Continued)

FOREIGN PATENT DOCUMENTS

| CN | 1366714 | 8/2002 |
| CN | 1975239 | 6/2007 |

(Continued)

OTHER PUBLICATIONS

Japanese Office Action dated Jul. 4, 2023 issued in Application No. 2021-512876.

(Continued)

*Primary Examiner* — Herve-Louis Y Assouman
*Assistant Examiner* — Christopher M Roland
(74) *Attorney, Agent, or Firm* — KED & ASSOCIATES, LLP

(57) ABSTRACT

The lighting assembly disclosed in the embodiment of the invention includes a substrate, light emitting devices on the substrate, a first resin layer covering the light emitting devices, and at least one second resin layer on the first resin layer, and a first cover disposed on an outer periphery of the substrate along an outer periphery of the substrate of the lighting module. The second resin layer is disposed on upper and side surfaces of the first resin layer, and the second resin layer includes at least one of phosphor and ink particles. The first cover includes an opening portion from which the second resin layer protrudes, a substrate cover portion disposed on an upper surface of the substrate around the opening portion, and a side cover portion extending lower than a side surface of the substrate from the substrate cover portion. An upper surface of the substrate cover portion may be disposed lower than the upper surface of the first resin layer.

19 Claims, 13 Drawing Sheets

(51) Int. Cl.
*H01L 33/50* (2010.01)
*H01L 33/54* (2010.01)
*H01L 33/56* (2010.01)
*H01L 33/62* (2010.01)

(52) U.S. Cl.
CPC ............ *H01L 33/507* (2013.01); *H01L 33/54* (2013.01); *H01L 33/56* (2013.01); *H01L 33/62* (2013.01)

(58) Field of Classification Search
CPC ....... H01L 33/507; H01L 33/54; H01L 33/56; H01L 33/62; F21S 41/20; F21S 43/14; F21S 43/16; F21S 43/19; F21S 43/195; F21S 43/26; F21W 2102/00
See application file for complete search history.

(56) References Cited

U.S. PATENT DOCUMENTS

| | | | |
|---|---|---|---|
| 7,045,828 B2 | 5/2006 | Shimizu et al. | |
| 7,250,637 B2 | 7/2007 | Shimizu et al. | |
| 7,259,403 B2 | 8/2007 | Shimizu et al. | |
| 7,375,381 B2 | 5/2008 | Shimizu et al. | |
| 8,981,636 B2 | 3/2015 | Matsuda et al. | |
| 9,166,120 B2 | 10/2015 | Moon et al. | |
| 9,228,714 B2 | 1/2016 | Park et al. | |
| 9,347,652 B2 | 5/2016 | Hino et al. | |
| 9,500,333 B1 | 11/2016 | Johnson et al. | |
| 9,869,449 B2 | 1/2018 | Park et al. | |
| 10,050,185 B2 | 8/2018 | Dijken et al. | |
| 10,451,225 B2 | 10/2019 | Ozaki et al. | |
| 11,365,851 B2 | 6/2022 | Ozaki et al. | |
| 2002/0153835 A1 | 10/2002 | Fujiwara et al. | |
| 2006/0160409 A1 | 7/2006 | Shimizu et al. | |
| 2007/0187708 A1 | 8/2007 | Setomoto et al. | |
| 2008/0129206 A1 | 6/2008 | Stam et al. | |
| 2012/0002427 A1 | 1/2012 | Moon et al. | |
| 2014/0029263 A1 | 1/2014 | Park et al. | |
| 2014/0063830 A1* | 3/2014 | Kim ................... | H05K 3/284 362/509 |
| 2014/0168988 A1 | 6/2014 | Petersen et al. | |
| 2014/0197443 A1 | 7/2014 | Moon et al. | |
| 2015/0176814 A1 | 6/2015 | Hino et al. | |
| 2015/0330596 A1 | 11/2015 | Park et al. | |
| 2016/0013374 A1 | 1/2016 | Dijken et al. | |
| 2017/0122503 A1 | 5/2017 | Ozaki et al. | |
| 2017/0368985 A1 | 12/2017 | Yokoyama et al. | |
| 2019/0097094 A1* | 3/2019 | Han ................... | H01L 33/502 |
| 2020/0003370 A1 | 1/2020 | Ozaki et al. | |
| 2021/0348739 A1* | 11/2021 | Lee ................... | F21V 31/005 |

FOREIGN PATENT DOCUMENTS

| | | |
|---|---|---|
| CN | 103733362 | 4/2014 |
| CN | 104728723 | 6/2015 |
| CN | 107062115 | 8/2017 |
| EP | 2735786 | 5/2014 |
| JP | 2005-044753 | 2/2005 |
| JP | 2009-123675 | 6/2009 |
| JP | 2014-026977 | 2/2014 |
| JP | 2014-229372 | 12/2014 |
| JP | 2015-149214 | 8/2015 |
| JP | 2016-134313 | 7/2016 |
| JP | 2017-84727 | 5/2017 |
| JP | 2017-157319 | 9/2017 |
| KR | 10-2012-0029307 | 3/2012 |
| KR | 10-2017-0052203 | 5/2017 |
| KR | 10-2018-0092640 | 8/2018 |
| WO | WO 2011/099288 | 6/2013 |
| WO | WO 2013/153739 | 10/2013 |
| WO | WO 2014/154722 | 10/2014 |

OTHER PUBLICATIONS

European Search Report dated Nov. 10, 2021 issued in Application No. 19860504.0.
Chinese Office Action dated May 31, 2023 issued in Application No. 201980059552.0.
Korean Office Action dated Apr. 13, 2023 issued in Application No. 10-2018-0108489.
International Search Report dated Dec. 20, 2019 issued in Application No. PCT/KR2019/011655.
Extended European Search Report dated Apr. 2, 2024 issued in Application No. 23215433.6.
Korean Office Action dated May 7, 2024 issued in Application No. 10-2024-0056249.

* cited by examiner

LIGHTING MODULE AND LIGHTING ASSEMBLY INCLUDING SAME

CROSS-REFERENCE TO RELATED PATENT APPLICATIONS

This application is a U.S. National Stage Application under 35 U.S.C. § 371 of PCT Application No. PCT/KR2019/011655, filed Sep. 9, 2019, which claims priority to Korean Patent Application No. 10-2018-0108489, filed Sep. 11, 2018, whose entire disclosures are hereby incorporated by reference.

TECHNICAL FIELD

An embodiment of the invention relates to a lighting module and a lighting assembly having a light emitting device. An embodiment of the invention relates to a lighting module and a lighting assembly providing a surface light source. An embodiment of the invention relates to a light unit or vehicle lamp having a lighting module or lighting assembly.

BACKGROUND ART

Typical lighting applications include vehicle lights as well as backlights for displays and signs. Light emitting device, such as light emitting diode (LED), have advantages such as low power consumption, semi-permanent life, fast response speed, safety, and environmental friendliness compared to conventional light sources such as fluorescent lamps and incandescent lamps. These light emitting diodes are applied to various display devices, various lighting devices such as indoor or outdoor lights. Recently, as a vehicle light source, a lamp employing a light emitting diode has been proposed. Compared with incandescent lamps, light emitting diodes are advantageous in that power consumption is small. However, since an emission angle of light emitted from the light emitting diode is small, when the light emitting diode is used as a vehicle lamp, there is a demand for increasing the light emitting area of the lamp using the light emitting diode. Since the light emitting diode is small, it may increase the design freedom of the lamp, and it is economical due to its semi-permanent life.

DISCLOSURE

Technical Problem

An embodiment of the invention may provide a lighting module in which a resin layer is disposed on a plurality of light emitting devices and emits surface light. An embodiment of the invention may provide a lighting module in which a plurality of resin layers is disposed on light emitting devices having a plurality of light exit surfaces. An embodiment of the invention may provide a lighting module in which a wavelength conversion means is added to at least one of a plurality of resin layers on a substrate and a light emitting device. An embodiment of the invention may provide a lighting module having ink particles on at least one of a plurality of resin layers disposed on a substrate and a light emitting device. An embodiment of the invention may provide a lighting module having a wavelength conversion means in a resin layer spaced apart from a substrate and a light emitting device. An embodiment of the invention may provide a lighting module having ink particles in a resin layer spaced apart from a substrate and a light emitting device. An embodiment of the invention may provide a lighting module in which a phosphor and ink particles are added to at least one of a plurality of resin layers disposed on a substrate. An embodiment of the invention may provide a lighting module in which ink particles are added to an uppermost layer of a plurality of resin layers disposed on a substrate and a light emitting device. An embodiment of the invention provides a flexible lighting module having a plurality of light emitting devices and a plurality of resin layers. An embodiment of the invention provides a lighting assembly capable of coupling a cover through an outer portion other than a light emitting region. An embodiment of the invention provides a lighting assembly including a first cover having an opening portion in which a resin layer protrudes, and a second cover under the substrate and the first cover. An embodiment of the invention provides a lighting assembly having a coupling structure for coupling between the first and second covers. An embodiment of the invention provides a lighting module having improved light extraction efficiency and light distribution characteristics, and a lighting assembly having the same.

Technical Solution

A lighting assembly according to an embodiment of the invention comprises a lighting module including a substrate, a plurality of light emitting devices on the substrate, a first resin layer covering the plurality of light emitting devices, and at least one second resin layer on the first resin layer; and a first cover disposed on an outer periphery of the substrate along an outer periphery of the substrate of the lighting module, wherein the second resin layer is disposed on an upper surface and a side surface of the first resin layer, and the second resin layer includes at least one of a phosphor and ink particles, and the first cover includes an opening portion from which the second resin layer protrudes, a substrate cover portion disposed on an upper surface of the substrate around the opening portion, and a side cover portion extending lower than a side surface of the substrate, and wherein an upper surface of the substrate cover portion may be disposed lower than an upper surface of the first resin layer.

According to an embodiment of the invention, a second cover includes a substrate support portion under the substrate of the lighting module and a stepped coupling portion around an outer periphery of the substrate support portion, and a side cover portion of the second cover may be coupled to a coupling portion of the second cover. The first and second covers may include a cable lead portion protruding from a region between the first and second covers and from which a power cable connected to the substrate is drawn out. The second cover includes a stepped groove in which a terminal on a lower surface of the substrate is exposed, and the stepped groove may be inclined toward one side of the lighting module. A distance between the side surface of the substrate and the side surface of the second resin layer may be at least 0.1 times the thickness of the lighting module. The upper surface of the substrate and the upper surface of the second resin layer may include a convex curved surface. The first cover may include a locking protrusion protruding toward the substrate. A plurality of opening portions may be disposed in the first cover, and each of a plurality of lighting modules may protrude from each of the opening portions.

A lighting assembly according to an embodiment of the invention comprises a lighting module including a substrate, a plurality of light emitting devices on the substrate, a first resin layer covering the plurality of light emitting devices, and at least one second resin layer on the first resin layer; and a cover including a first cover disposed on an outer periphery of the substrate along an outer periphery of the substrate of the lighting module and a second cover supporting a lower portion of the lighting module, wherein the second resin layer is disposed on a surface of the first resin layer and includes at least one of a wavelength converting means and ink particles therein, and the first cover includes an opening portion in which the first and second resin layers protrude, a substrate cover portion disposed on an upper surface of the substrate around the opening portion, and a side cover portion extending from the substrate cover portion to a side surface of the substrate, wherein the cover includes a first and a first and second coupling member concave toward the substrate from both sides adjacent to one end of the lighting module.

According to an embodiment of the invention, a side surface of the second resin layer may include a convex curved surface. An edge of the substrate may extend outwardly than the lower periphery of the second resin layer. A thickness of the lighting module may be 5.5 mm or less. Each of the plurality of light emitting devices may have a flip chip type and may be disposed on the substrate. The second resin layer includes a phosphor and ink particles in a resin material, a content of the phosphor in the second resin layer is 23 wt % or less, and a content of the ink particles may range from 3 wt % to 13 wt %.

Advantageous Effects

According to an embodiment of the invention, since the resin layer includes at least one of a phosphor and ink particle therein, hot spots may be reduced and light may be uniformly distributed. The lighting module may be installed without using complex fixtures. The lighting module may support and fix portions other than the light emitting region. By attaching the cover to the lighting module, assembly of the lighting module or user convenience may be improved.

BEST MODE

Figure 1:
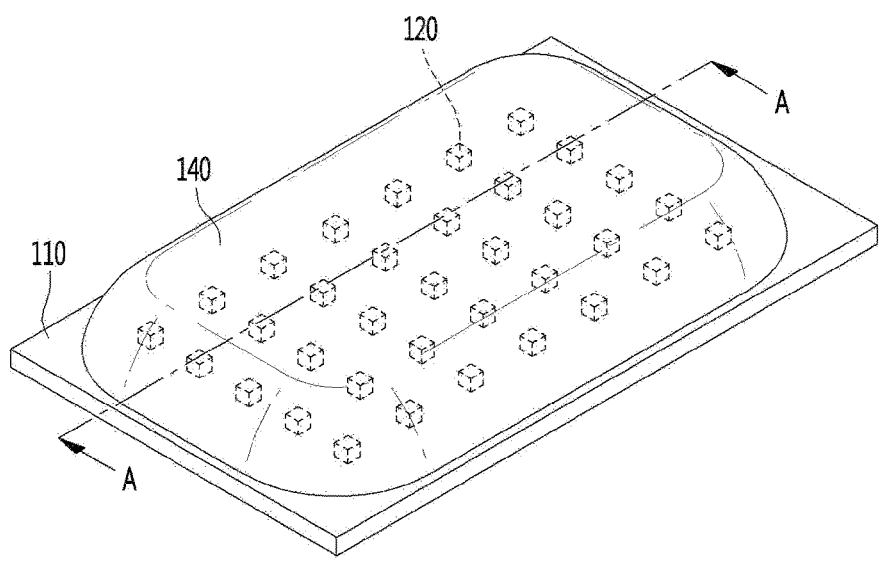
FIG. 1 is a perspective view showing a lighting module according to a first embodiment.

Hereinafter, preferred embodiments of the invention will be described in detail with reference to the accompanying drawings. However, the technical spirit of the invention is not limited to some embodiments to be described, and may be implemented in various other forms, and one or more of the components may be selectively combined and substituted for use within the scope of the technical spirit of the invention. In addition, the terms (including technical and scientific terms) used in the embodiments of the invention, unless specifically defined and described explicitly, may be interpreted in a meaning that may be generally understood by those having ordinary skill in the art to which the invention pertains, and terms that are commonly used such as terms defined in a dictionary should be able to interpret their meanings in consideration of the contextual meaning of the relevant technology. Further, the terms used in the embodiments of the invention are for explaining the embodiments and are not intended to limit the invention. In this specification, the singular forms also may include plural forms unless otherwise specifically stated in a phrase, and in the case in which at least one (or one or more) of A and (and) B, C is stated, it may include one or more of all combinations that may be combined with A, B, and C. In describing the components of the embodiments of the invention, terms such as first, second, A, B, (a), and (b) may be used. Such terms are only for distinguishing the component from other component, and may not be determined by the term by the nature, sequence or procedure etc. of the corresponding constituent element. And when it is described that a component is "connected", "coupled" or "joined" to another component, the description may include not only being directly connected, coupled or joined to the other component but also being "connected", "coupled" or "joined" by another component between the component and the other component. In addition, in the case of being described as being formed or disposed "above (on)" or "below (under)" of each component, the description includes not only when two components are in direct contact with each other, but also when one or more other components are formed or disposed between the two components. In addition, when expressed as "above (on)" or "below (under)", it may refer to a downward direction as well as an upward direction with respect to one element.

The lighting device according to the invention may be applied to a variety of lamp devices that require lighting, such as vehicle lamps, home lighting devices, or industrial lighting devices. For example, when applied to vehicle lamps, it is applicable to headlamps, sidelights, side mirrors, fog lights, tail lamps, brake lights, daytime running lights, vehicle interior lights, door scars, rear combination lamps, backup lamps, etc. The lighting device of the invention may be applied to indoor and outdoor advertising devices, display devices, and various electric vehicle fields, and in addition, it may be applied to all lighting-related fields or advertisement-related fields that are currently developed and commercialized or that may be implemented according to future technological developments.

Figure 2:
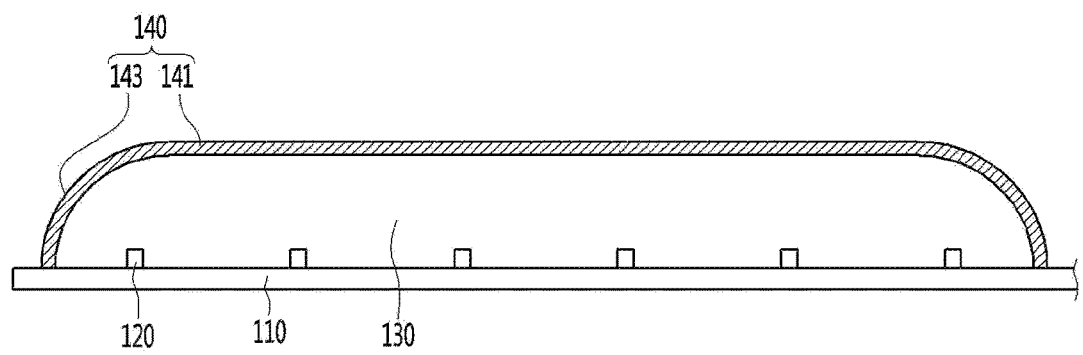
FIG. 2 is a cross-sectional view taken along line A-A of the lighting module of FIG. 1.
Figure 3:
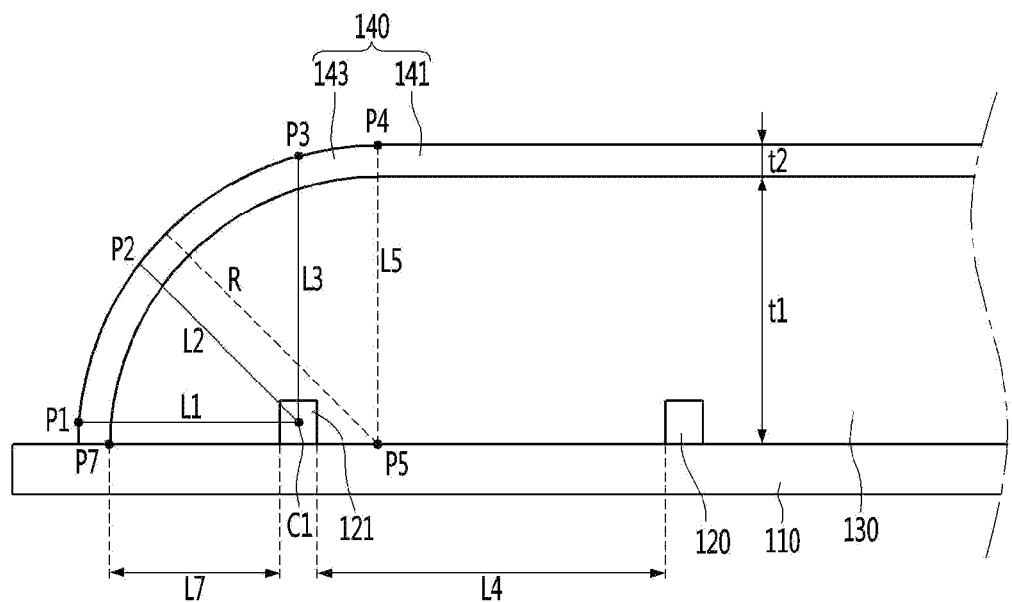
FIG. 3 is a diagram illustrating a curved portion of the second resin layer of FIG. 2.

FIG. 1 is a perspective view showing a lighting module according to a first embodiment, FIG. 2 is a cross-sectional view taken along line A-A of the lighting module of FIG. 1, and FIG. 3 is a view for explaining a curved portion of the second resin layer of FIG. 2.

Referring to FIGS. 1 to 3, the lighting module 100 may have a polyhedral shape, for example, a hexahedral shape. The lighting module 100 may be formed in a structure capable of multi-sided light emission. For example, light may be emitted from the upper surface and a plurality of side surfaces of the lighting module 100. Although the lighting module 100 is shown to emit light to five-sided surfaces, it may be a six-sided light emitting module in which light is emitted through a lower surface. The lighting module 100 may include a substrate 110, a plurality of light emitting devices 120 disposed on the substrate 110, a first resin layer 130 disposed on the light emitting device 120, and one or a plurality of second resin layers 140 disposed on the first resin layer 130. The lighting module 100 may be applied to various lamp devices that require lighting, such as vehicle lamps, home lighting devices, and industrial lighting devices. For example, in the case of lighting modules applied to vehicle lamps, it is applicable to head lamps, vehicle width lamps, side mirror lamps, fog lamps, tail lamps, turn signal lamps, back up lamps, and stop lamps, daytime running right, vehicle interior lighting, door scarf, rear combination lamp, backup lamp, etc.

The substrate 110 may include an insulating or conductive material. The substrate 110 may be formed of a rigid or flexible material. The substrate 110 may be formed of a transparent or opaque material. The substrate 110 may include, for example, at least one of a resin-based printed circuit board (PCB), a metal core PCB, a flexible PCB, a ceramic PCB, or an FR-4 substrate. A thickness of the substrate 110 may be 0.5 mm or less, for example, in a range of 0.3 mm to 0.5 mm. Since the thickness of the substrate 110 is provided thin, the thickness of the lighting module may not be increased. Since the thickness of the substrate 110 is 0.5 mm or less, it is possible to support a flexible module. The thickness of the substrate 110 may be 0.1 times or less, or 0.1 to 0.06 times a distance from the lower surface of the substrate 110 to an upper surface of the uppermost second resin layer 140.

A reflective layer (not shown) may be disposed on the substrate 110. The reflective layer may be disposed between the substrate 110 and the first resin layer 130. The reflective layer serves to guide light generated from the light emitting device 120 upward. The reflective layer may include a white material. The reflective layer may include a resin material. The reflective layer may include a material of PMMA, silicon, or epoxy, and may include, for example, at least one of $TiO_2$, $SiO_2$, and $Al_2O_3$ therein. Here, a distance from the lower surface of the substrate 110 to the upper surface of the uppermost second resin layer 140 may be a module thickness. The thickness of the lighting module 100 may be 5.5 mm or less from the bottom of the substrate 110, in a range of 4.5 mm to 5.5 mm, or 4.5 mm to 5 mm. The thickness of the lighting module 100 may be a linear distance between the lower surface of the substrate 110 and the upper surface of the second resin layer 140. The thickness of the lighting module 100 may be 220% or less of the thickness of the first resin layer 130, for example, in the range of 180% to 220%. Since the lighting module 100 has a thickness of 5.5 mm or less, it may be provided as a flexible and slim surface light source module. In addition, the light emitted from the lighting module 100 having the above-described thickness may provide a surface light source with a uniform light distribution. That is, the hot spot of the surface light source may be reduced and light distribution may be improved.

The light emitting device 120 may be disposed on the substrate 110. N number of light emitting devices 120 may be arranged in a first direction of the substrate 110, and M number of light emitting devices 120 may be arranged in a second direction orthogonal to the first direction. The N and M may be 1 or more, or any one of N or M may be 1 or more and the other may be 2 or more. The light emitting devices 120 may be disposed at the same intervals in the first and second directions, or at least one may be disposed at different intervals. For example, the spacing distance between the light emitting devices 120 may be equally arranged to effectively realize surface light. The light emitting device 120 may be provided as an LED chip, and may emit light of blue, green, red, white, infrared or ultraviolet light. The light emitting device 120 may emit blue light in the range of 420 nm to 470 nm, for example. The light emitting device 120 may be provided as a compound semiconductor. The light emitting device 120 may be provided as, for example, a group II-VI or a group III-V compound semiconductor. For example, the light emitting device 120 may be provided by including at least two or more elements selected from aluminum (Al), gallium (Ga), indium (In), phosphorus (P), arsenic (As), and nitrogen (N).

The light emitting device 120 may include a first conductivity type semiconductor layer, an active layer, and a second conductivity type semiconductor layer. The first and second conductivity type semiconductor layers may be implemented with at least one of a group III-V or a group II-VI compound semiconductor. The first and second conductivity type semiconductor layers may be formed of, for example, a semiconductor material having a composition formula of $In_xAl_yGa_{1-x-y}N$ ($0 \le x \le 1$, $0 \le y \le 1$, $0 \le x+y \le 1$). For example, the first and second conductivity type semiconductor layers may include at least one selected from the group including GaN, AlN, AlGaN, InGaN, InN, InAlGaN, AlInN, AlGaAs, GaP, GaAs, GaAsP, and AlGaInP, etc. The first conductivity type semiconductor layer may be an n-type semiconductor layer doped with an n-type dopant such as Si, Ge, Sn, Se, and Te. The second conductivity type semiconductor layer may be a p-type semiconductor layer doped with a p-type dopant such as Mg, Zn, Ca, Sr, and Ba. The active layer may be implemented as a compound semiconductor. The active layer may be implemented with at least one of a group III-V or a group II-VI compound semiconductor. When the active layer is implemented in a multi-well structure, the active layer may include a plurality of well layers and a plurality of barrier layers alternately disposed, and may be disposed of a semiconductor material of $In_xAl_yGa_{1-x-y}N$ ($0 \le x \le 1$, $0 \le y \le 1$, $0 \le x+y \le 1$). For example, the active layer may include at least one selected from the group including InGaN/GaN, GaN/AlGaN, AlGaN/AlGaN, InGaN/AlGaN, InGaN/InGaN, AlGaAs/GaAs, InGaAs/GaAs, InGaP/GaP, AlInGaP/InGaP, and InP/GaAs. The light emitting device 120 may emit light through an upper surface and at least one side surface, and, for example, may emit light through an upper surface and four side surfaces. The light emitting device 120 may include a substrate made of a light-transmitting material, and the substrate made of a light-transmitting material may be disposed on the uppermost semiconductor layer. The light emitting device 120 may be a flip chip type and may be disposed on the substrate 110.

The first resin layer 130 may be disposed on the substrate 110 and the light emitting device 120. The first resin layer 130 may be disposed on the upper and side surfaces of the plurality of light emitting devices 120. The first resin layer 130 may include an upper surface and a plurality of side surfaces. An upper surface of the first resin layer 130 may face the upper surfaces of the plurality of light emitting devices 120, and a portion of the side surfaces may face side surfaces of the plurality of light emitting devices 120. The side surface of the first resin layer 130 may be perpendicular to the upper surface of the substrate 110 or may include a curved surface. When the side surface of the first resin layer 130 faces the light emitting device 120, light emitted through the side surface of the first resin layer 130 may not contribute to light distribution and may be loss. In order to reduce such loss of light, the side surface of the first resin layer 130 may include a curved surface, for example, a convex curved surface. When the side surface of the first resin layer 130 is formed in a curved surface, incident light may be refracted toward the upper surface thereof. In the first resin layer 130, a boundary portion between an upper surface and a side surface may be a curved portion. The curved portion may be continuously connected to the upper surface and the side surface of the first resin layer 130. The curved portion may be an edge portion of an upper surface of the first resin layer 130 or an edge portion of side surfaces.

The first resin layer 130 may be a transparent resin material, for example, a resin material such as UV (Ultra violet) resin, silicone, or epoxy. The UV resin, for example, may use as a main material a resin (oligomer type) having urethane acrylate oligomer as a main raw material. For example, urethane acrylate oligomer, which is a synthetic oligomer, may be used. The main material may further include a monomer in which isobornyl acrylate (IBOA), hydroxybutyl acrylate (HBA), and hydroxy metaethyl acrylate (HEMA), which are low boiling point diluent type reactive monomers, are mixed, and as an additive, a photoinitiator (for example, 1-hydroxycyclohexyl phenyl-ketone, Diphenyl), Diphenyl (2,4,6-trimethylbenzoyl phosphine oxide), an antioxidant or the like may be mixed. The UV resin may be formed of a composition including 10 to 21% of an oligomer, 30 to 63% of a monomer, and 1.5 to 6% of an additive. In this case, the monomer may be a mixture of 10 to 21% of isobornyl acrylate (IBOA), 10 to 21% of hydroxybutyl acrylate (HBA), and 10 to 21% of hydroxy metaethyl acrylate (HEMA). The additive may be added in an amount of 1 to 5% of a photoinitiator to be able to perform a function of initiating photoreactivity, and may be formed of a mixture capable of improving yellowing by adding 0.5 to 1% of an antioxidant. The formation of the resin layer 130 using the above-described composition may form a layer with a resin such as UV resin instead of a light guide plate to adjust the refractive index and the thickness, and simultaneously, may satisfy all of adhesive characteristics, reliability and a mass production rate by using the above-described composition. The resin layer 130 may further include a beads or diffusion agent therein. The diffusion agent may have a spherical shape, and its size may range from 4 μm to 6 μm. The shape and size of the diffusion agent are not limited thereto. The content of the diffusion agent may be 5 wt % or less, for example, 2 wt % to 5 wt % in the first resin layer 130. When the content of the diffusing agent is less than the above range, there is a limit to lowering the hot spot, and when it is larger than the above range, the light transmittance may decrease. Accordingly, the diffusion agent is disposed in the first resin layer 130 in the amount, thereby diffusing light to reduce hot spots without lowering the light transmittance. When a diffusion material or a light blocking material is disposed on the second resin layer 140, the diffusion agent of the first resin layer 130 may be removed. In the lighting module, the first resin layer 130 is formed as a single layer, but the invention is not limited thereto and may include two or more resin layers. The first resin layer 130 may include a light transmitting layer containing no impurities and a diffusion layer including a diffusion agent on the light-transmitting layer. Alternatively, a diffusion layer may be formed under the light transmitting layer.

The second resin layer 140 may be formed on the first resin layer 130. The second resin layer 140 may include a transparent material or a transparent insulating material. The second resin layer 140 may be molded on the surface of the first resin layer 130. The second resin layer 140 may be made of a resin material such as epoxy or silicone. For example, the second resin layer 140 may be made of silicon, and may be made of silicon having different chemical bonds. The silicon is a polymer in which silicon as an inorganic material and carbon as an organic material are combined, and has thermal stability, chemical stability, abrasion resistance, gloss, etc., which are characteristics of inorganic materials and reactivity, solubility, elasticity, and processability, etc., which are characteristics of organic materials. The silicon may include general silicon and fluorine silicon having an increased fluorine ratio. Increasing the fluorine ratio of the fluorine silicone has an effect of improving moisture resistance. The second resin layer 140 may include a wavelength conversion means for receiving light emitted from the light emitting device 120 and providing wavelength-converted light. For example, the second resin layer 140 may include at least one selected from a group including phosphors, quantum dots, and the like. The phosphor or quantum dot may emit blue, green, or red light.

The phosphor may be evenly disposed inside the second resin layer 140. The phosphor may include a phosphor of a fluoride compound, and for example, may include at least one of an MGF-based phosphor, a KSF-based phosphor, or a KTF-based phosphor. The phosphor may emit light with different peak wavelengths, and light emitted from the light emitting device 120 may emit light with different yellow and red or different red peak wavelengths. When the phosphor is a red phosphor, the red phosphor may have a wavelength range of 610 nm to 650 nm, and the wavelength may have a width of less than 10 nm. The red phosphor may include a fluoride-based phosphor. The fluoride-based red phosphor may be coated with a fluoride containing no Mn, or an organic material coating may be further included on the surface of the phosphor or the surface of the fluoride coating containing no Mn in order to improve reliability at high temperature/high humidity. In the case of the fluoride-based red phosphor as described above, unlike other phosphors, since a width of 10 nm or less may be realized, it may be used in a high-resolution device. The phosphor composition according to the embodiment should basically conform to stoichiometry, and each element may be substituted with another element in each group on the periodic table. For example, Sr may be substituted with Ba, Ca, Mg, etc. of the alkaline earth II group, and Y may be substituted with Tb, Lu, Sc, Gd of the lanthanum series. In addition, Eu or the like as an activator may be substituted with Ce, Tb, Pr, Er, Yb, etc. according to a desired energy level, and a sub-activator or the like may be additionally applied to the activator alone or to modify properties. The quantum dots may include a compound semiconductor of group II-VI or a group III-V compound, and may emit red light. The quantum dots may be, for example, ZnS, ZnSe, ZnTe, CdS, CdSe, CdTe, GaN, GaP, GaAs, GaSb, InP, InAs, In, Sb, AlS, AlP, AlAs, PbS, PbSe, Ge, Si, $CuInS_2$, $CuInSe_2$ and the like, and combinations thereof.

The second resin layer 140 may include ink particles therein. The ink particles may include at least one of metal ink, UV ink, or curing ink. A size of the ink particles may be smaller than a size of the phosphor. A surface color of the ink particles may be any one of green, red, yellow, and blue. The types of inks may be selectively applied from PVC (poly vinyl chloride) ink, PC (polycarbonate) ink, ABS (acrylonitrile butadiene styrene copolymer) ink, UV resin ink, epoxy ink, silicone ink, PP (polypropylene) ink, water-based ink, plastic ink, PMMA (poly methyl methacrylate) ink and PS (polystyrene) ink. Here, the width or diameter of the ink particles may be 5 µm or less, for example, in a range of 0.05 µm to 1 µm. At least one of the ink particles may have a size smaller than the wavelength of light. The color of the ink particles may include at least one of red, green, yellow, and blue. For example, the phosphor emits a red wavelength, and the ink particles may include red. For example, the red color of the ink particles may be darker than the color of the phosphor or the wavelength of light. The ink particles may have a color different from the color of light emitted from the light emitting device. The ink particles may have an effect of blocking or blocking incident light.

The second resin layer 140 may include at least two or more of a diffusion agent, ink particles, and phosphors. The second resin layer 140 may include ink particles and phosphors without a diffusion agent. The content of the phosphor may be added in the same amount as the resin material forming the second resin layer 140. A ration of the phosphor and a resin material of the second resin layer 140 may be added in a ratio of 40% to 60% compared to 40% to 60%. For example, the phosphor and the resin material of the second resin layer 140 may be added in the same ratio, for example, 50% to 50%. A difference of the content of the phosphor and the resin material of the second resin layer 140 may be 20% or less or 10% or less. In the embodiment, the content of the phosphor in the second resin layer 140 is added in the range of 40 wt % or more or 40 wt % to 60 wt %, so that the color of the surface of the second resin layer 140 may be provided as a color of the phosphor, and a light diffusion and wavelength conversion efficiency may be improved. In addition, transmission of the wavelength of light emitted from the light emitting device 120 through the second resin layer 140, for example blue light, may be reduced. In addition, light extracted through the second resin layer 140 may be provided as a surface light source according to the wavelength of the phosphor. The second resin layer 140 may be provided with a thickness thinner than that of the first resin layer 130. When the thickness of the second resin layer 140 is thick, light transmittance may decrease, and when the second resin layer 140 is thin, wavelength conversion efficiency may decrease.

The thickness of the second resin layer 140 may be, for example, in the range of 0.3 mm to 0.5 mm. The thickness of the second resin layer 140 may be 25% or less of the thickness of the first resin layer 130, for example, in the range of 16% to 25%. When the thickness of the second resin layer 140 is thicker than the above range, the light extraction efficiency may decrease or the module thickness may increase. When it is smaller than the above range, it may be difficult to suppress hot spots or the wavelength conversion efficiency may decrease. In addition, the second resin layer 140 is a layer for wavelength conversion and external protection, and when it is thicker than the above range, a ductility characteristic of the module may be deteriorated, and design freedom may be lowered. The phosphor or quantum dots added to the second resin layer 140 may include at least one or two or more of amber light, yellow light, green light, red light, and blue light.

Since the second resin layer 140 includes a phosphor, an exterior color may be shown as the color of the phosphor. The surface of the second resin layer 140 or the surface of the lighting module may be provided as a red image when the light emitting device 120 is turned off, and when the light emitting device 120 is turned on, it has a predetermined luminous intensity. Red light may be diffused to provide a red image of a surface light source. The color coordinate of the surface color may have a different value within the color of the phosphor depending on whether the light emitting device 120 is turned on or off. Phosphors and ink particles may be included in the second resin layer 140. The emission wavelength of the phosphor and the ink particles may include the same color or the same-colored color. The colored-color may be one of the colors of the phosphors. The content of the phosphor in the second resin layer 140 may be 23 wt % or less, for example, in a range of 12 wt % to 23 wt %, and the content of the ink particle may include 3 wt % or more, for example, in a range of 3 wt % to 13 wt %. Since the weight of the ink particles is smaller than the weight of the phosphor, the ink particles may be distributed in a region adjacent to the surface of the second resin layer 140 than the phosphor. Accordingly, the color of the surface of the second resin layer 140 may be provided as the color of ink particles. The transmission of light may be suppressed by these ink particles, and the hot spot may be lowered. When the ink particles are red, the outer surface of the lighting module 100 may be seen in red when the light emitting device 120 does not light up. That is, when the light is turned on or turned off, the lighting module 100 is all displayed in red, thereby preventing a sense of heterogeneity due to color difference. The second resin layer 140 may include a first layer to which a phosphor is added and a second layer to which the ink particles are added, and the first layer may be disposed between the first resin layer 130 and the second layer. By separately stacking the second layer having the ink particles, it is possible to reduce the phosphor content of the first layer.

As shown in FIG. 2, the second resin layer 140 may include a first region 141 formed on the first resin layer 130 and a second region 143 disposed on a side surface of the first resin layer 130. The first region 141 of the second resin layer 140 may overlap some of N light emitting devices 120 in a direction perpendicular to the substrate 110. The first region 141 of the second resin layer 140 may be formed so as not to overlap a part of at least one light emitting device 120 disposed on the outermost side of the substrate 110. The first region 141 of the second resin layer 140 may be disposed parallel to the upper surface of the substrate 110. The width of the first region 141 of the second resin layer 140 may be smaller than the width of the substrate 110 in the first and second directions. An edge of the first region 141 of the second resin layer 140 may be disposed inside the side surface of the substrate 110. The first region 141 of the second resin layer 140 may include a flat surface.

The second region 143 of the second resin layer 140 may extend from the edge of the first region 141 of the second resin layer 140 toward the substrate 110. The second region 143 of the second resin layer 140 may include a curved surface. The second region 143 of the second resin layer 140 may include a curved surface convex to the outside. The second region 143 of the second resin layer 140 may be formed to overlap the light emitting device 120 disposed on the outermost side of the substrate 110 in a vertical direction of the substrate 110. The first region 141 may be defined as a flat portion or an upper surface portion. The second region 143 may be defined as a side portion or a curved portion. In the embodiment, the thickness of the first region 141 of the second resin layer 140 and the thickness of the second region 143 of the second resin layer 140 may be formed to correspond, but are not limited thereto. Here, the thickness of the first region 141 may be a thickness in a vertical direction or a vertical distance, and the thickness of the second region 143 may be a horizontal distance from an outer surface of the first resin layer 140 to the second region 43.

As described above, since the second resin layer 140 is formed to have a curved side, the distance between the edge region of the second resin layer 140 and the light emitting device 120 disposed at the outermost side of the substrate 100 may be reduced. Accordingly, the second resin layer 140 may prevent dark lines from occurring at an interface between the first region 141 and the second region 143. In the above, the arrangement structure of the light emitting device, the resin layer, and a layer having phosphor or ink particles was mainly described, but in order to remove dark lines and improve the uniformity of light, the relationship between the distance between the light emitting device and the phosphor layer, and the curvature radius of the second region of the phosphor layer, the thickness of the resin layer and the phosphor layer becomes important.

Therefore, in the following, detailed specifications of each component of the lighting module will be described in more detail. As shown in FIG. 3, the second region 143 of the second resin layer 140 may include a curved surface. The second region 143 of the second resin layer 140 may include a first point P1, a second point P2, and a third point P3. The first point P1, the second point P2, and the third point P3 may be points on an outer surface of the second region 143 of the second resin layer 140. Here, the plurality of light emitting devices 120 include a first light emitting device 121, and the first light emitting device 121 is disposed around the outer periphery of the first resin layer 120 among a plurality of light emitting devices, or may be a light emitting device adjacent to a side surface of the resin layer 120. The first point P1 may be a region in contact with an outer surface of the second region 143 of the second resin layer 140 in a horizontal direction from the center C1 of the first light emitting device 121 which is most adjacent to the side surface of the first resin layer 130. The third point P3 may be a region in contact with the outer surface of the second region 143 of the second resin layer 140 and a straight line perpendicular from the center C1 of the first light emitting device 121. The horizontal direction may be a direction parallel to or horizontal to the upper surface of the substrate 110, and the vertical direction may be a direction perpendicular to the upper surface of the substrate 110. The second point P2 may be a region between the first point P1 and the third point P3 of the second region 143 of the second resin layer 140.

A first distance L1 from the center C1 of the first light emitting device 121 to the first point P1, a second distance L2 from the center C1 of the first light emitting device 121 to the second point P2, and a third distance L3 from the center C1 of the first light emitting device 121 to the third point P3 may be formed differently from each other. The third distance L3 from the center C1 of the first light emitting device 121 to the third point P3 may be formed greater than the first distance L1 from the center C1 of the first light emitting device 121 and the first point P1 and the second distance L2 from the center C1 of the first light emitting device 121 to the second point P2. The second distance L2 from the center C1 of the first light emitting device 121 and the second point P2 may be formed greater than the first distance L1 from the center C1 of the first light emitting device 121 to the first point P1. Conventionally, since a second distance L2 between the center C1 of the first light emitting device 121 and the second point P2 is formed significantly farther than a third distance L3 between the center C1 of the first light emitting device 121 and the third point P3 and the first distance L1 between the center C1 of the first light emitting device 121 and the first point P1, there has been a problem that dark lines occur at the second point P2. In the embodiment, since the second region 143 of the second resin layer 140 is curved to reduce the second distance L2 between the center C1 of the first light emitting device 121 and the second point P2, there is an effect of preventing the occurrence of dark lines on the second resin layer 140. In addition, the embodiment improves the light uniformity of the side surface of the second resin layer 140 by forming a curved surface such that there is little difference between the values of the first distance L1, the second distance L2, and the third distance L3. In addition, uniformity of light between the upper and side surfaces of the second resin layer 140 may be improved. Actually, the distance values of the first distance L1, the second distance L2, and the third distance L3 are different, but the distance difference is very small toward the upper and side surfaces of the second resin layer 140. Therefore, it is difficult to recognize the difference in luminance when viewed from the outside.

The first distance L1 between the center C1 of the first light emitting device 121 and the first point P1 may be determined according to the distance between the light emitting devices 120. The light emitting device 120 may be disposed such that the distance L4 between the first light emitting device 121 and a light emitting device adjacent thereto may be 5.5 mm to 6.5 mm. When the distance L4 between the first light emitting device 121 and a light emitting device adjacent thereto exceeds 6.5 mm, a hot spot may occur in a region where the light emitting device 120 is disposed when viewed from the outside. The first light emitting device 121 may be disposed such that the first distance L1 between the center C1 of the first light emitting device 121 and the first point P1 may be 44% to 55% of the fourth distance L4 between the light emitting devices 120. For example, the first distance L1 between the center C1 of the first light emitting device 121 and the first point P1 may be determined to be around 3 mm. When the first distance L1 between the center C1 of the first light emitting device 121 and the first point P1 is less than 44% or exceeds 55% of the fourth distance L4 between the light emitting devices 120, light emitted through the second region 143 of the second resin layer 140 may appear excessively bright or dark, resulting in a problem in that light uniformity is deteriorated.

The radius of curvature R of the second region 143 of the second resin layer 140 may be determined according to the thickness of the second resin layer 140 and the first resin layer 130. The radius of curvature R of the second region 143 of the second resin layer 140 may be formed equal to or greater than the sum of the thickness t1 of the first resin layer 130 in a direction perpendicular to the substrate 110 and the thicknesses t2 of the first region 141 of the second resin layer 140. For example, the radius of curvature R of the second region 143 of the second resin layer 140 may be formed to be 100% to 110% of the sum of the thickness t1 of the first resin layer 130 in a direction perpendicular to the substrate 110 and the thickness t2 of the first region 141 of the second resin layer 140. Here, the thickness t1 of the first resin layer 130 may be 3.5 mm to 5 mm, and the thickness t2 of the first region 141 of the second resin layer 140 may be 0.5 mm or less, for example, in a range of 0.3 mm to 0.5 mm. Accordingly, the radius of curvature R of the second region 143 of the second resin layer 140 may be 5.5 mm to 6.0 mm. Here, when the thickness t2 of the first region 141 of the second resin layer 140 is formed to be less than 0.5 mm, the light efficiency may be increased. In addition, the second resin layer 140 may include a fourth point P4 between the first region 141 and the second region 143. The fourth point P4 may be disposed in a region of the outer surface of the second resin layer 140. Also, a fifth point P5 may be included on the substrate 110 having the shortest distance from the fourth point P4. The distance L5 between the fourth point P4 of the second resin layer 140 and the fifth point P5 of the substrate 110 may be greater than the first distance L1 from the first point P1 of the second region 143 of the second resin layer 140 to the first light emitting device 121. In addition, the distance L5 between the fourth point P4 of the second resin layer 140 and the fifth point P5 of the substrate 110 may be formed to be less than or equal to the radius of curvature R of the second region 143 of the second resin layer 140.

The second resin layer 140 may include a seventh point P7 where the second region 143 of the second resin layer 140 and the substrate 110 contact each other. The seventh point P7 may be on an inner surface of the second resin layer 140 where the second region 143 of the second resin layer 140 and the first resin layer 130 contact each other. The distance L7 between the seventh point P7 of the second region 143 of the second resin layer 140 and the side surface of the light emitting device 120 may be formed less than the distance L4 between the light emitting devices 120. The fifth point P5 formed on the substrate 110 may be disposed in a region larger than the distance from the seventh point P7 to the first light emitting device 121 and smaller than or equal to the radius of curvature R. have. As described above, the radius of curvature R of the second region 143 of the second resin layer 140 may be determined through various conditions of the lighting module 100.

Figure 4:
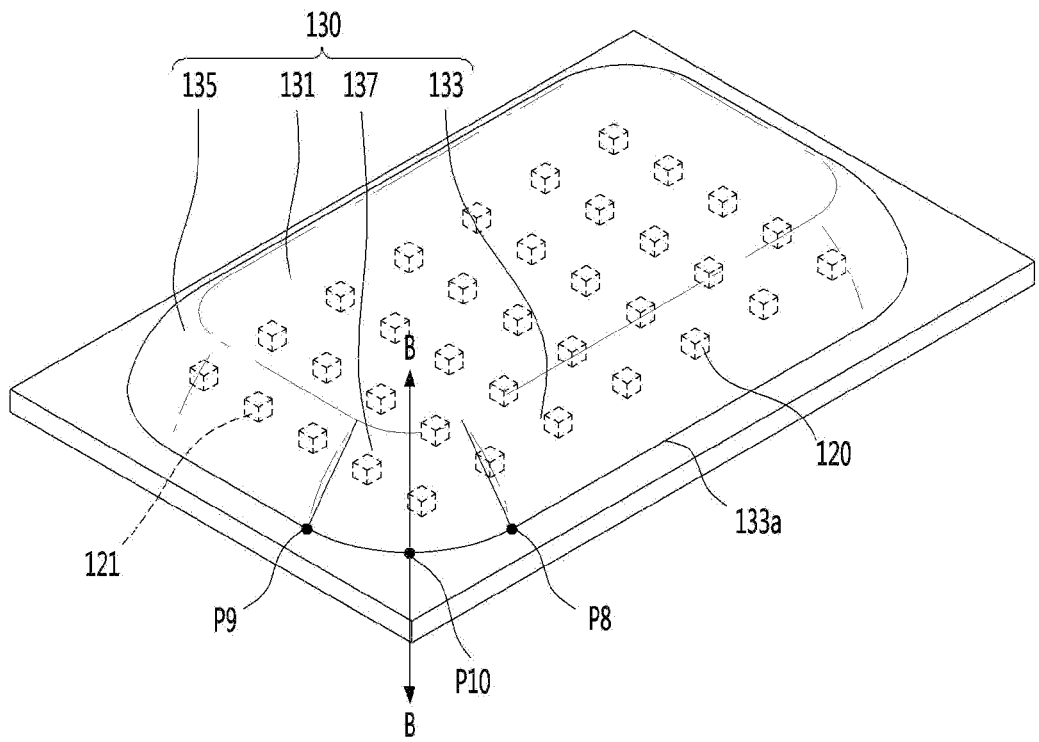
FIG. 4 is a perspective view illustrating a curved portion of a first resin layer in the lighting module of FIG. 1.
Figure 5:
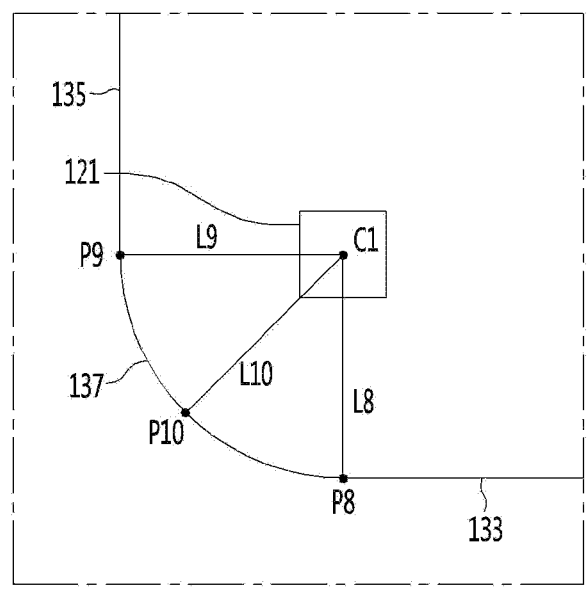
FIG. 5 is a plan view illustrating a relationship according to a distance between a light emitting device and a first resin layer in FIG. 4.
Figure 6:
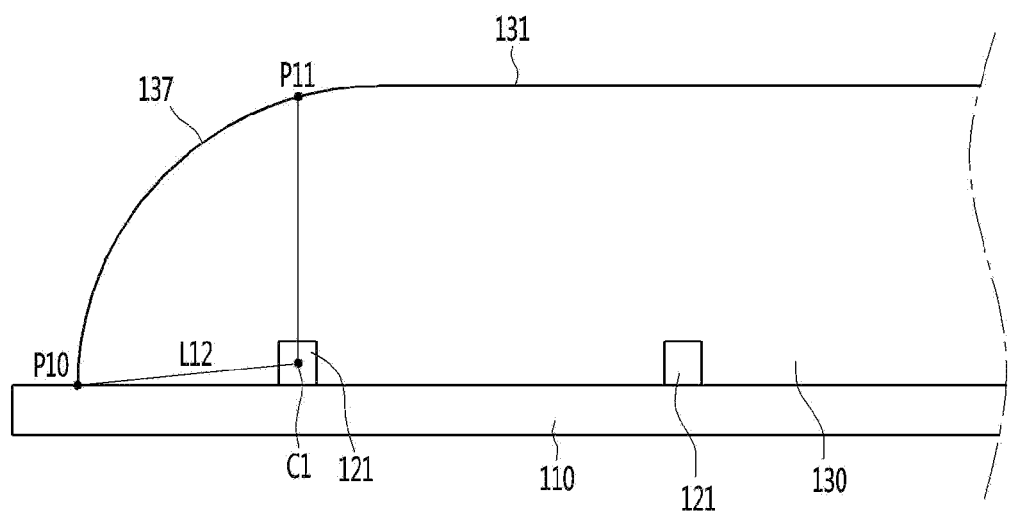
FIG. 6 is a cross-sectional view taken along line B-B of FIG. 4.

FIG. 4 is a perspective view showing a first resin layer in the lighting module of FIG. 2, FIG. 5 is a plan view illustrating a relationship according to a distance between a light emitting device and a first resin layer, and FIG. 6 is a cross-sectional view taken along B-B of FIG. 4. As shown in FIG. 4, the first resin layer 130 may include a flat upper surface 131, a first side surface 133 bent toward the substrate 110 from the upper surface 131, a second side surface 135 disposed adjacent to the first side surface 133, and an edge region 137 disposed between the first side surface 133 and the second side surface 135. The first side surface 133, the second side surface 135, and the edge region 137 may include a curved surface.

The upper surface 131 of the first resin layer 130 may be in contact with a lower portion of the first region of the second resin layer. The side surfaces 133 and 135 and the edge regions 137 of the first resin layer 130 may contact the second region of the second resin layer. That is, the upper surface 131, the side surfaces 133 and 135, and the edge regions 137 of the first resin layer 130 may be formed in a shape corresponding to the inner surface of the second resin layer. The first resin layer 130 may include an eighth point P8 where the first side surface 133 of the first resin layer 130 and the edge region 137 contact in a region in contact with the upper surface of the substrate 110. The first resin layer 130 may include a ninth point P9 where the second side surface 135 and the edge region 137 contact in a region in contact with the upper surface of the substrate 110. The first resin layer 130 may include a tenth point P10 that is an outer surface of the edge region 137 in a region in contact with the upper surface of the substrate 110. Here, a region where the first resin layer 130 and the upper surface of the substrate 110 contact each other may include a straight line 133a.

As shown in FIG. 5, a distance L10 from the center C1 of the first light emitting device 121 adjacent to the edge region 137 on the first resin layer 130 to the tenth point P10 of the edge region 137 may be formed equal to a distance L8 from the center C1 of the first light emitting device 121 to the eighth point P8 of the first resin layer 130. The distance L10 from the center C1 of the first light emitting device 121 adjacent to the edge region 137 on the first resin layer 130 to the tenth point P10 of the edge region 137 may be formed equal to a distance L9 from the center C1 of the light emitting device 121 to the ninth point P9 of the first resin layer 130. Accordingly, the light emitted from the edge region 137 of the first resin layer 130 may be emitted to have the same brightness as the light emitted from the first side surface 133 and the second side surface 135 of the first resin layer 130.

As shown in FIG. 6, the outer side surface of the edge region 137 of the first resin layer 130 may include an eleventh point P11, which is the shortest distance perpendicular to the substrate 110 from the center C1 of the first light emitting device 121. Therefore, the line distance L11 from the center C1 of the first light emitting device 121 to the eleventh point P11 may be formed greater than the distance L10 from the center C1 of the first light emitting device 121 to the tenth point P10. That is, the edge region 137 of the first resin layer 130 may be increased the distance from the first light emitting device 121 to the sides surface toward the upper surface of the first resin layer 130, similar to the side surfaces of the first resin layer 130. It may be seen that the lighting module of the first embodiment may prevent the occurrence of dark lines by forming the boundary region between the side and the side in a curved surface. In addition, by forming the side surface of the lighting module to have a curved surface, it may be seen that the overall light luminance of the lighting module is uniform.

Figure 7:
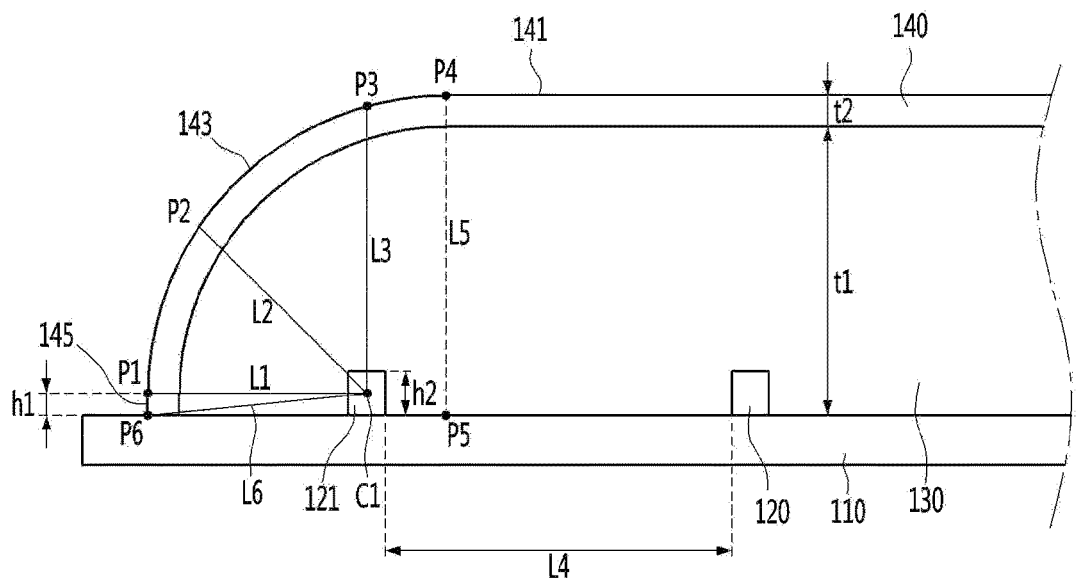
FIG. 7 is a diagram illustrating another example of the lighting module of FIG. 4.

As shown in FIG. 7, a third region 145 of the second resin layer 140 may be vertically disposed between the second region 143 of the second resin layer 140 and the substrate 110. One end of the third region 145 of the second resin layer 140 may be in contact with the second region 143 of the second resin layer 140 and the other end of the third region 145 of the second resin layer 140 may be in contact with the upper surface of the substrate 110 may be in contact with the upper surface. A height h1 of the third region 145 of the second resin layer 140 may be smaller than a height h2 of the light emitting device 120. In the embodiment, the thickness of the first region 141 of the second resin layer 140, the thickness of the second region 143 of the second resin layer 143, and the thickness of the third region 145 of the second resin layer 140 may be formed to correspond. The second region 143 of the second resin layer 140 may include a first point P1, a second point P2, and a third point P3. The first point P1, the second point P2, and the third point P3 may be on an outer side surface of the second region 143 of the second resin layer 140. The first point P1 may be a region in contact with the outer surface of the second region 143 of the second resin layer 140 in a horizontal direction to the substrate 110 at the center C1 of the light emitting device 120 which is most adjacent to the side surface of the first resin layer 130. The first point P1 may be a region in contact with the second region 143 and the third region 145 of the second resin layer 140. The second point P2 may be on any one of the outer surfaces of the second region 143 of the second resin layer 140. The third point P3 may be a region in contact with a straight line perpendicular to the substrate 110 from the center C1 of the first light emitting device 121 and the outer surface of the second region 143 of the second resin layer 140.

The first distance L1 between the center C1 of the first light emitting device 121 and the first point P1, and the second distance L2 between the center C1 of the first light emitting device 121 and the second point P2, and the third distance L3 between the center C1 of the first light emitting device 121 and the third point P3 may be formed differently from each other. The third distance L3 from the center C1 of the first light emitting device 121 to the third point P3 may be formed greater than the first distance L1 from the center C1 of the first light emitting device 121 to the first point P1 and the second distance L2 from the center C1 of the first light emitting device 121 to the second point P2. The second distance L2 between the center C1 of the first light emitting device 121 and the second point P2 may be formed greater than the first distance L1 from the center C1 of the first light emitting device 121 to the first point P1. The second resin layer 140 may include a fourth point P4 between the first region 141 and the second region 143. The fourth point P4 may be disposed on the outer surface of the second resin layer 140. Also, a fifth point P5 may be included on the substrate 110 having the shortest distance from the fourth point P4. The distance L5 between the fourth point P4 of the second resin layer 140 and the fifth point P5 of the substrate 110 may be greater than a distance from from the first point P1 of the second region 143 of the second resin layer 140 to the first light emitting device 121. In addition, the distance L5 between the fourth point P4 of the second resin layer 140 and the fifth point P5 of the substrate 110 may be less than or equal to the radius of the curvature R of the second region 143 of the second resin layer 140. The third region 145 of the second resin layer 140 may include a sixth point P6. The sixth point P6 may be a region in which the outer surface of the third region 145 of the second resin layer 140 and the upper surface of the substrate 110 contact each other. The distance L6 from the center C1 of the first light emitting device 121 to the sixth point P6 may be greater than the distance L1 from the center C1 of the first light emitting device 121 to the first point P1.

Since the lighting module according to the embodiment has a second resin layer 140 having a straight line perpendicular to the upper surface of the substrate 110 on the side surface of the first resin layer 130, there is an effect of forming more uniform luminance of light emitted to the side surface.

Figure 8:
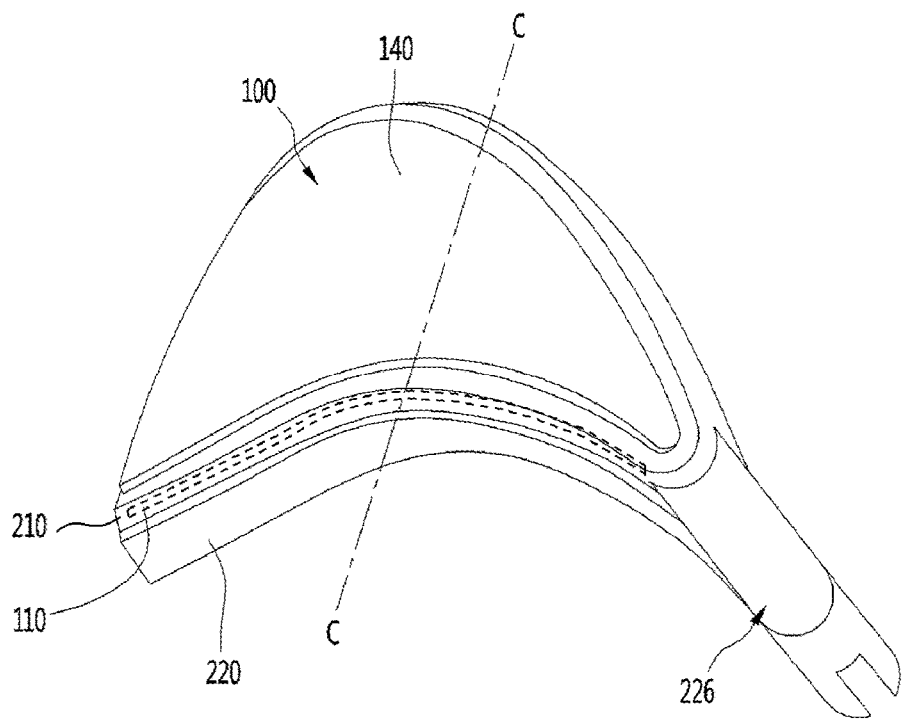
FIG. 8 is a perspective view showing a lighting assembly having a lighting module according to a second embodiment.
Figure 9:
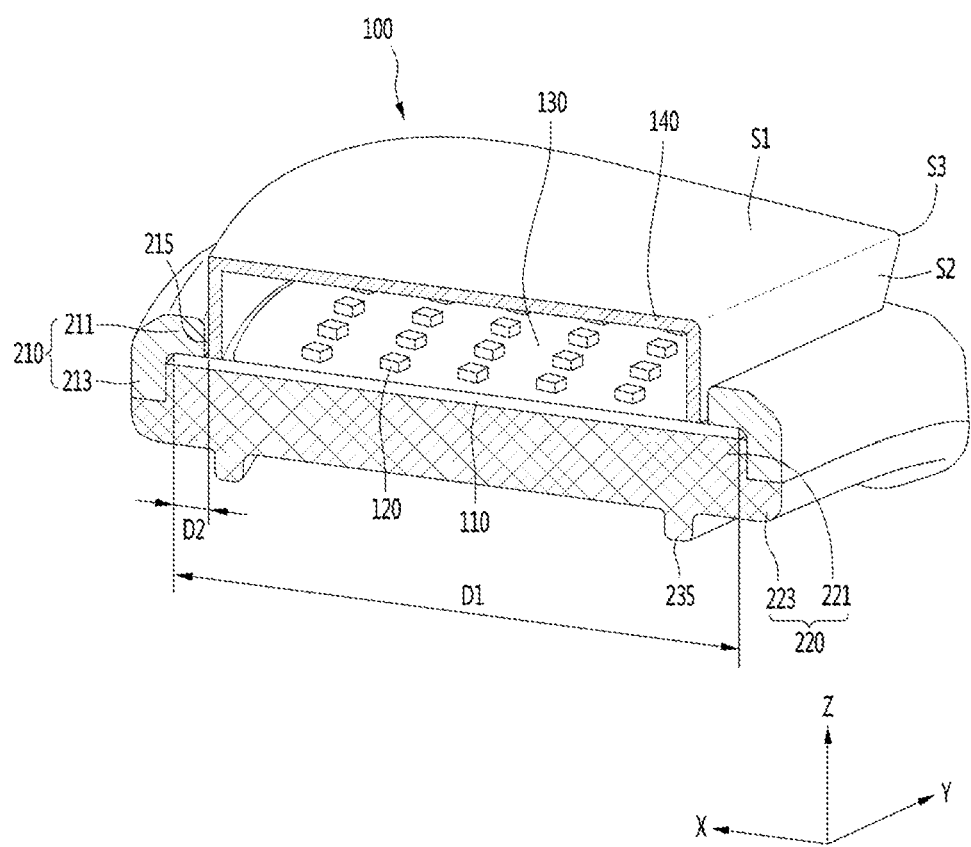
FIG. 9 is a cross-sectional view taken along line C-C of the lighting assembly of FIG. 8.

FIG. 8 is a perspective view of a lighting assembly having a lighting module according to the second embodiment, and FIG. 9 is a cross-sectional view taken along line C-C of the lighting assembly of FIG. 8. Referring to FIGS. 8 and 9, the lighting assembly may include the lighting module 100 disclosed above, a first cover 210 having an opening portion 215 in which the first and second resin layers 130 and 140 of the lighting module 100 protrude, a second cover 220 supporting the first cover 210 and the lighting module 100. The first cover 210 may be a sub bezel, an upper or a top cover, and the second cover 220 may be a lower bezel, a lower or a bottom cover.

In the lighting module 100, the substrate 110 and the first and second resin layers 130 and 140 may have a predetermined curvature and may be coupled to the first and second covers 210 and 220. The first and second covers 210 and 220 may support and fix a region other than the light emitting region of the lighting module 100. The emission region may be a region of the first and second resin layers 130 and 140 on the light emitting device 120. The upper surface area of the substrate 110 of the lighting module 100 may be larger than the lower surface area of the first resin layer 130. An outer portion of the substrate 110 may extend further outward from each edge of the first resin layer 130. A length D2 of the outer portion of the upper surface of the substrate 110 is a distance from the side surface of the second resin layer 130 to the edge of the substrate, and may be 0.1 times or greater of the thickness of the lighting module. For example, the length D2 of the outer portion may be 1 mm or less, for example, in the range of 0.3 mm to 1 mm. When it is smaller than the above range, there is no support effect, and when it is larger than the above range, material loss or module size may increase. The outer portion of the substrate 110 is a non-emission region without a resin layer, and the first cover 210 and the second cover 220 are coupled to the outer portion to facilitate assembly and use of the lighting module 100 may provide.

The first cover 210 may include a substrate cover portion 211 having an opening portion 215 and a side cover portion 213 outside the substrate cover portion 211. The size of the upper surface of the opening portion 215 may be larger than the size of the lower surface of the first resin layer 130, so that the second resin layer 140 may protrude through the opening portion 215. The upper surface S1 and the side surface S2 of the second resin layer 140 may be curved or flat, and the edge portion S3 between the upper surface S1 and the side surface S2 may be curved. The second resin layer 140 may be disposed on an upper surface and a side surface of the first resin layer 130. The substrate cover portion 211 is spaced apart from the second resin layer 140 to prevent the first resin layer 130 from being exposed. That is, the second resin layer 140 disposed on the side surface S2 of the first resin layer 140 may prevent the first resin layer 130 from being exposed from the substrate cover portion 211.

The substrate cover portion 211 protects the upper surface of the substrate 110. The substrate cover portion 211 covers an outer upper surface of the substrate 110 and faces the side surface S2 of the second resin layer 140. The upper surface of the substrate cover portion 211 may be disposed lower than the upper surface S1 of the second resin layer 140, for example, disposed at a point less than half a height of the upper surface of the second resin layer 140. The upper surface of the substrate cover portion 211 may be disposed lower than the upper surface of the first resin layer 130. Accordingly, blocking of light by the substrate cover portion 211 may be minimized with respect to the side light emitted from the lighting module 100.

The side cover portion 213 may be bent or extended toward the second cover 220 through the substrate cover portion 211. The side cover portion 213 covers the side surface of the substrate 110 and may protect the side surface of the substrate 110. The side cover portion 213 may protrude lower than the lower surface of the substrate 110. At least one or both of the substrate cover portion 211 and the side cover portion 213 may include a coupling member (not shown) coupled to the substrate 110 and the second cover 220. The coupling member may include a hook or a locking jaw structure. The second cover 220 has a thickness greater than that of the first cover 210 and supports the lighting module 100.

The second cover 220 may include a substrate support portion 221 under the substrate 110 and a coupling portion 223 under the substrate support portion 221. The substrate support portion 221 is disposed under the substrate 110 and may be adhered to the substrate 110. The substrate support portion 221 has an upper surface width or an upper surface area that is wider than a lower surface width D1 or a lower surface area of the substrate 110 and supports the substrate 110. The coupling portion 223 is provided in a stepped structure from the substrate support portion 221, and the side cover portion 213 is coupled to the coupling portion 223. The coupling portion 223 may have a hook or a locking groove structure and may be coupled to the side cover portion 213. A support protrusion 235 may be disposed under the first cover 210, but the embodiment is not limited thereto. One or a plurality of the support protrusions may be arranged. The material of the first and second covers 210 and 220 may be made of plastic or may include a resin material having good moisture resistance. As another example, at least one of the first and second covers 210 and 220 may include a metal material. Since the first and second covers 210 and 220 are provided as covers 210 and 220 supporting the outer and lower portions of the lighting module 100 having a thickness of 5.5 mm or less, assembly or installation using the lighting assembly having the lighting module 100 may be easy. In addition, when the lighting assembly is used, durability or reliability may be improved even when used for a long time.

The first and second covers 210 and 220 may have a curved shape or a straight shape along the outer shape of the lighting module 100. The first and second covers 210 and 220 may include a cable lead portion 226 through which a power cable drawn from the lighting module 100 is disposed. The cable lead portion 226 may protrude from a region between the first and second covers 210 and 220. The power cable may be connected to the substrate 110 of the lighting module 100.

Figure 10:
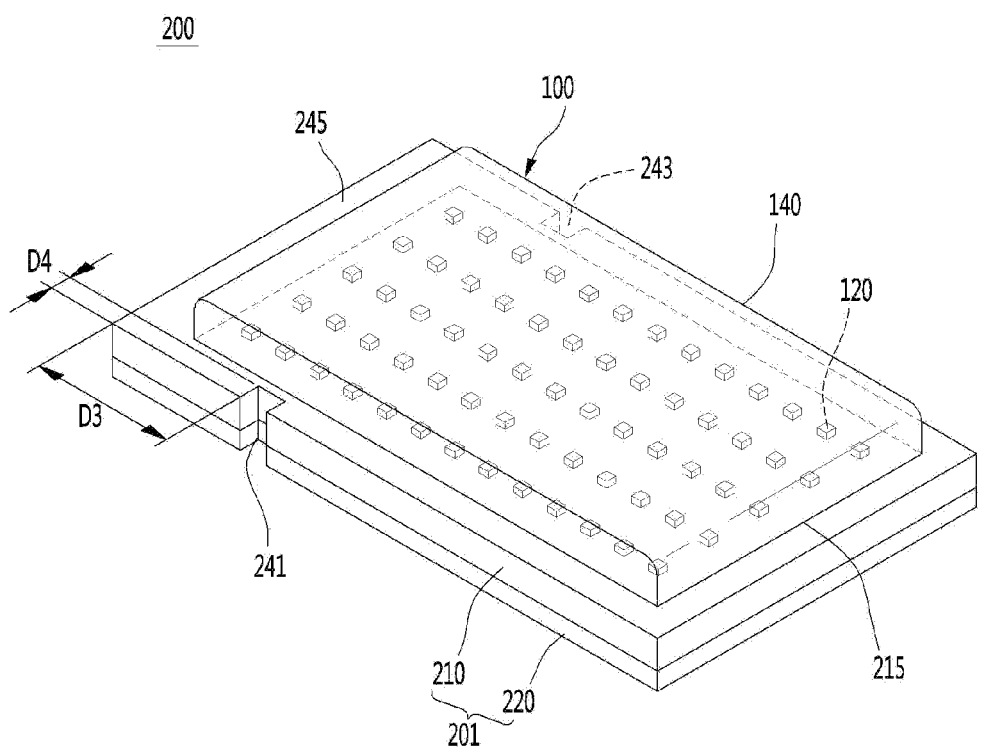
FIG. 10 is a perspective view showing a lighting assembly having a lighting module according to a third embodiment.
Figure 11:
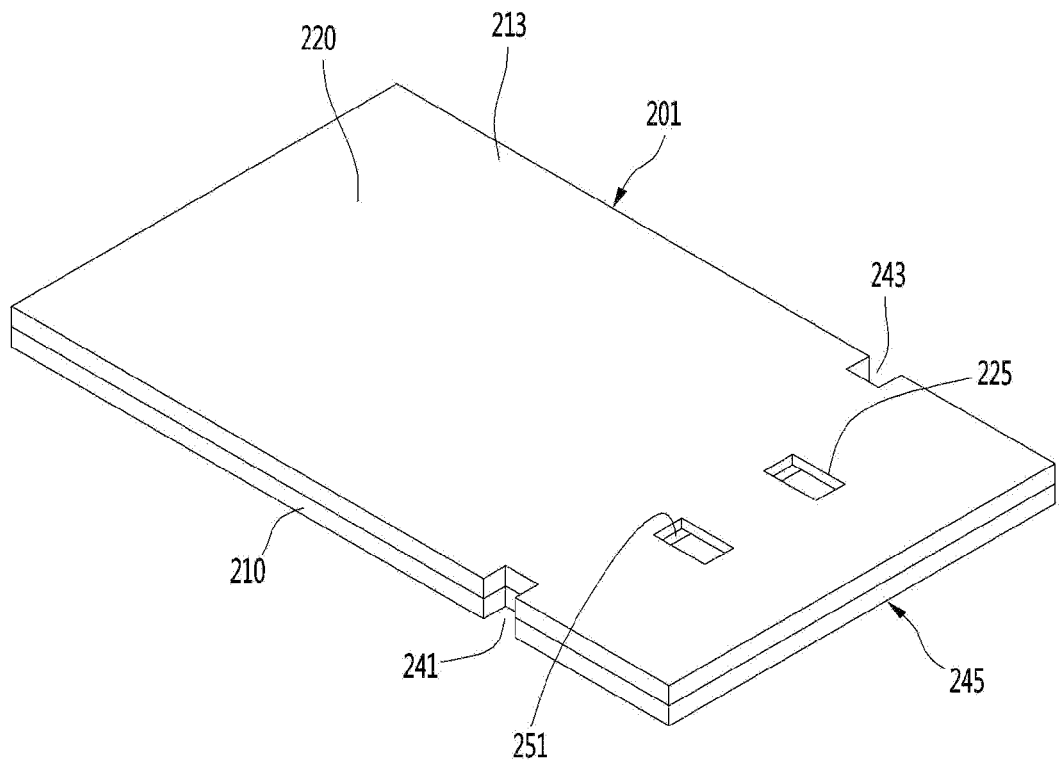
FIG. 11 is a rear view of the lighting assembly of FIG. 10.
Figure 12:
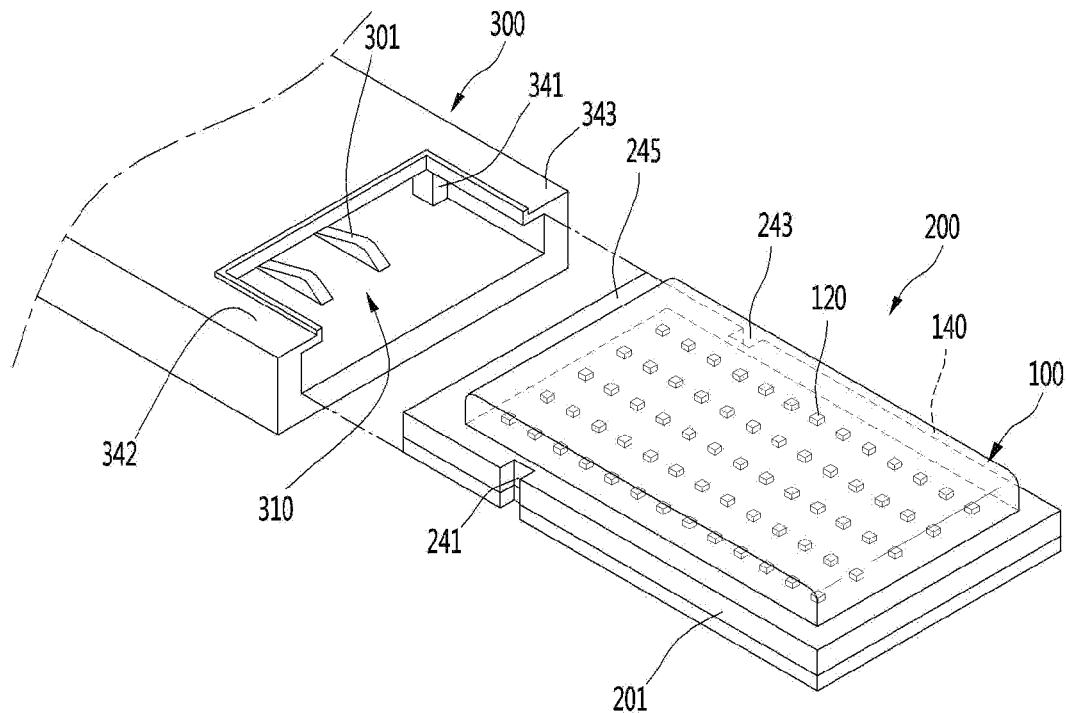
FIG. 12 is an exemplary view before combining the lighting assembly of FIG. 10 and a main frame.
Figure 13:
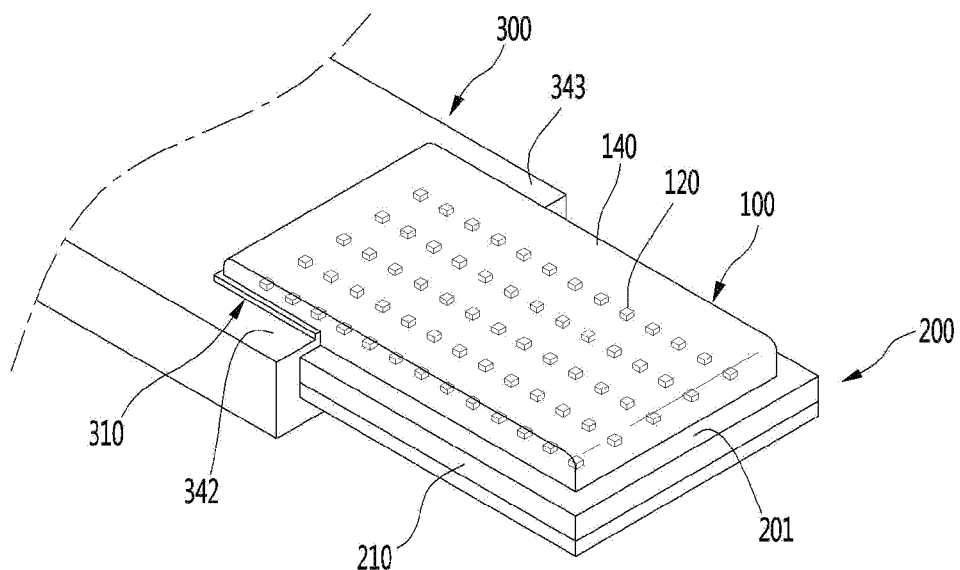
FIG. 13 is a perspective view illustrating an example of a combination of the lighting assembly of FIG. 12 and a main frame.
Figure 14:
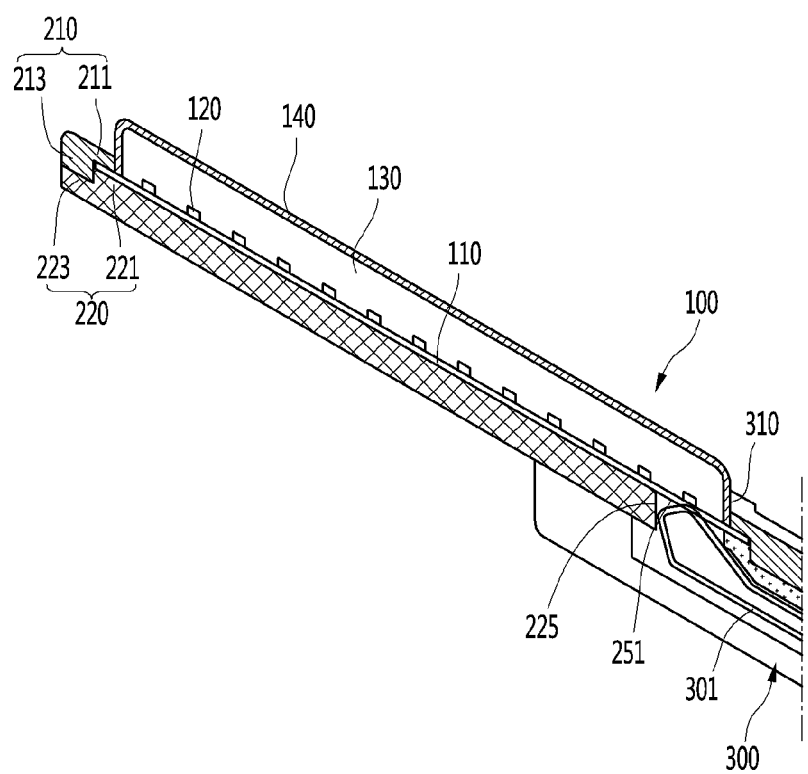
FIG. 14 is a side cross-sectional view showing an electrical contact structure of the lighting assembly in the coupling structure of FIG. 13.
Figure 15:
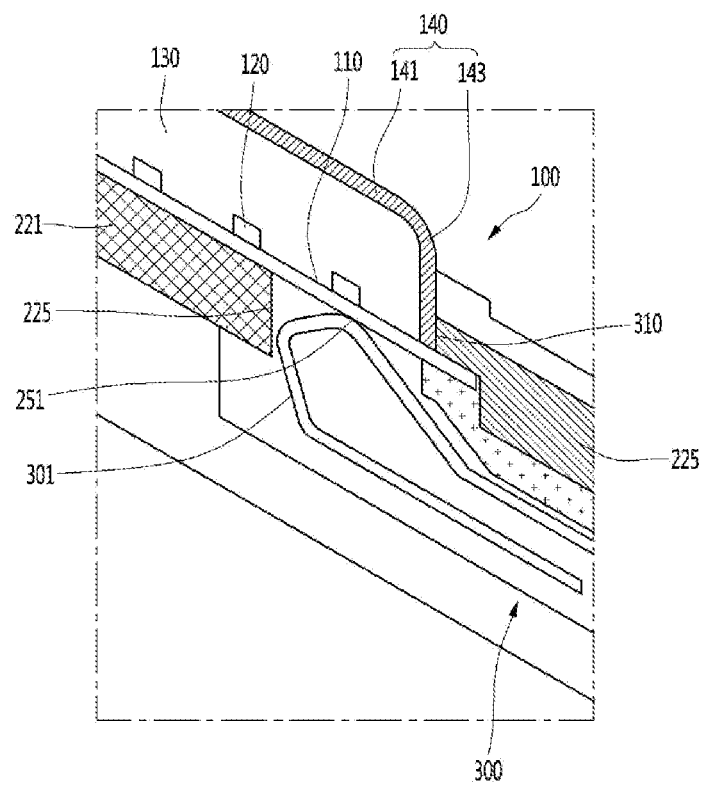
FIG. 15 is a partially enlarged view of a coupling structure of FIG. 14.

FIG. 10 is a perspective view showing a lighting assembly having a lighting module according to a third embodiment, FIG. 11 is a rear view of the lighting assembly of FIG. 10, and FIG. 12 is an exemplary view before combining the lighting assembly of FIG. 10 and the main frame. FIG. 13 is a perspective view showing an example of a combination of the lighting assembly of FIG. 12 and the main frame, FIG. 14 is a side cross-sectional view showing an electrical contact structure of the lighting assembly in the combination structure of FIG. 13, and FIG. 15 is a partial enlarged view of a combination structure of FIG. 14.

Referring to FIGS. 10 to 12, the lighting assembly 200 may include the lighting module 100 disclosed above, and a first cover 210 having an opening portion 215 from which the second resin layer 140 of the lighting module 100 protrudes, and the second cover 220 supporting the first cover 210 and the lighting module 100. The first cover 210 may be a sub bezel, an upper or a top cover, and the second cover 220 may be a lower bezel, a lower or a bottom cover. The first and second covers 210 and 220 may be coupled through a coupling member or an adhesive member, but the embodiment is not limited thereto. The first and second covers 210 and 220 may be defined as a cover 201.

The cover 201: 210, 220 may include first and second coupling members 241 and 243 spaced apart from the coupling front end 245, and the first and second coupling members 241 and 243 may be disposed at positions corresponding to both sides of the lighting module 100. The first and second coupling members 241 and 243 may be spaced apart from the coupling front end 245 by the same distance D3. The first and second coupling members 241 and 243 may include locking grooves that are concave toward the lighting module 100 from side surfaces of the first and second covers 210 and 220. As another example, the first and second coupling members may be provided as locking projections. The coupling front end portion 245 may be one side surface disposed to one end of the cover or in a coupling direction. The locking grooves that are the first and second coupling members 241 and 243 may be disposed at a depth D4 where the substrate 110 of the lighting module 100 is not exposed. The depth D4 of the locking grooves may be arranged to be less than ½ of the width of the first cover 210, and when the depth is out of the above range, the substrate 110 may be exposed and a stiffness of the first cover 210 may decrease. The locking groove may be provided in a structure having a narrow inlet and a wider inside than the inlet, or may be provided in a structure inclined toward the coupling front end portion 245. A plurality of terminal grooves 225 are disposed on the rear surface of the second cover 220 or in the substrate support portion 221, and the terminal grooves 225 expose the rear surface of the substrate 110. Terminals 251 of the substrate 110 may be exposed in the terminal grooves 225, respectively. The terminal grooves 225 may be disposed adjacent to the coupling front end portion 245. The side surface of the terminal grooves 225 may be inclined in either side direction, and may include, for example, a surface inclined toward the coupling front end portion into which the contact terminal is inserted. The terminal grooves 225 may be disposed closer to the first and second coupling members 241 and 243 with respect to the coupling front end portion 245 or may be disposed closer to one end of the lighting module.

As shown in FIG. 12, the lighting assembly 200 may be coupled to the main case 300. In the main case 300, an insertion hole 310 and a locking protrusion 341 may be disposed outside the insertion hole 310, and a contact terminal 301 may be disposed on the bottom of the insertion hole 310. Guide portions 342 and 343 for guiding around the inlet may be disposed in the insertion hole 301. The coupling portion 223 disposed at the front end of the lighting module 100 may be inserted into and coupled to the insertion hole 301. The insertion hole 301 may provide an open region so that an upper portion of the second resin layer 140 of the lighting module 100 may protrude. In the lighting assembly 200 of FIG. 12, the coupling front end portion 245 corresponds to the insertion hole 310 of the main case 300, and is coupled as shown in FIG. 13. At this time, the outer periphery of the lighting assembly 200 is inserted into the insertion hole 210 and inserted along the guide portions 342 and 343, and the terminal grooves 225 of the first and second coupling members 241 and 243 of the lighting module 100 are hooked and coupled to the locking protrusions 341. The locking protrusions 341 may protrude from both sidewalls of the insertion hole 210 in a direction facing each other. As another example, a locking protrusion may be formed in the lighting module, and a locking groove may be disposed in the assembly.

As shown in FIGS. 14 and 15, a contact terminal 301 disposed at the bottom of the insertion hole 310 of the main case 300 is inserted into the terminal groove 225 of the second cover 220, and the contact terminal 301 may contact the terminal 251 of the substrate 110 of the lighting module 100. At this time, the contact terminal 301 may have a leaf spring shape and may provide a predetermined elasticity, and thus may be in close contact with the terminal 251 of the substrate 110. Here, the lighting assembly 200 is supported by the main case 300 through the coupling front end portion 245 and is electrically connected to the contact terminal 301 through the stepped groove 225, so that the combination the main case 300 and the the lighting assembly 200 may be completed. A portion of the contact terminal 301 protrudes in the direction of the insertion hole 301 and may have a spring shape having an elastic repulsive force. The lighting assembly 200 may be coupled to or separated from the main case 300. The lighting assembly 200 has been described as an example of exposing the terminal 251 of the substrate 110 to the lower portion of the second cover 220, but the terminal may be disposed on the upper surface or a lower surface of a substrate 110 positioned on the coupling front end portion 245. The above-described lighting assembly 200 provides a connection of a power cable and a mechanical mounting structure, so that the assembly 200 having the lighting module 100 may be coupled to the main case 300 without using separate equipment. Such a lighting assembly may be improved in assembling or detachability to the main case.

Figure 16:
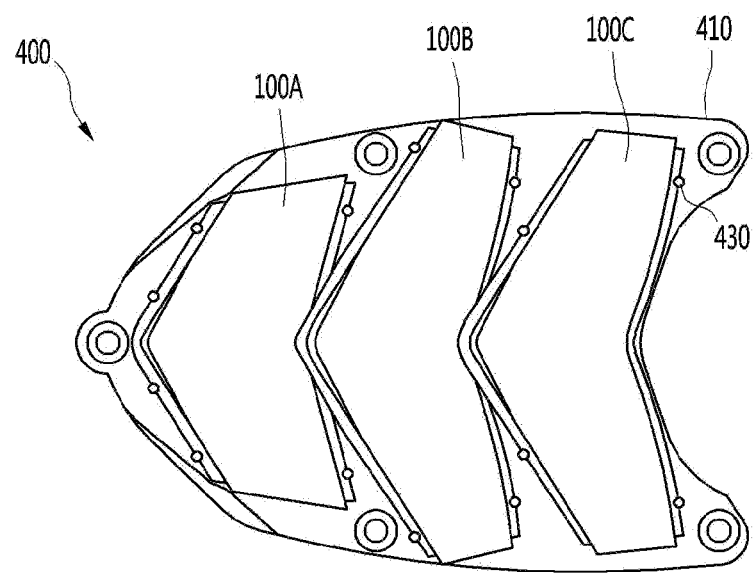
FIG. 16 is a plan view of a lighting assembly according to a fourth embodiment.
Figure 17:
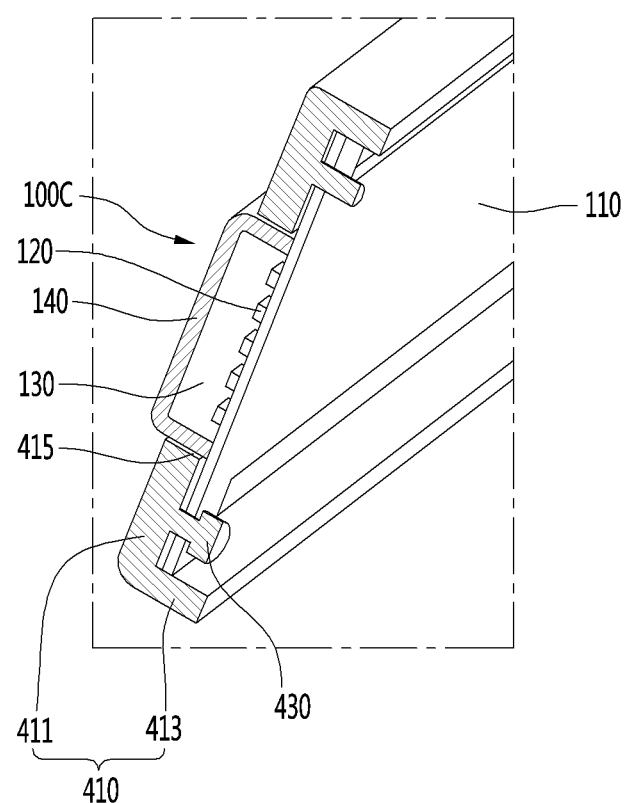
FIG. 17 is an example of a side cross-sectional view of the lighting assembly of FIG. 16.
Figure 18:
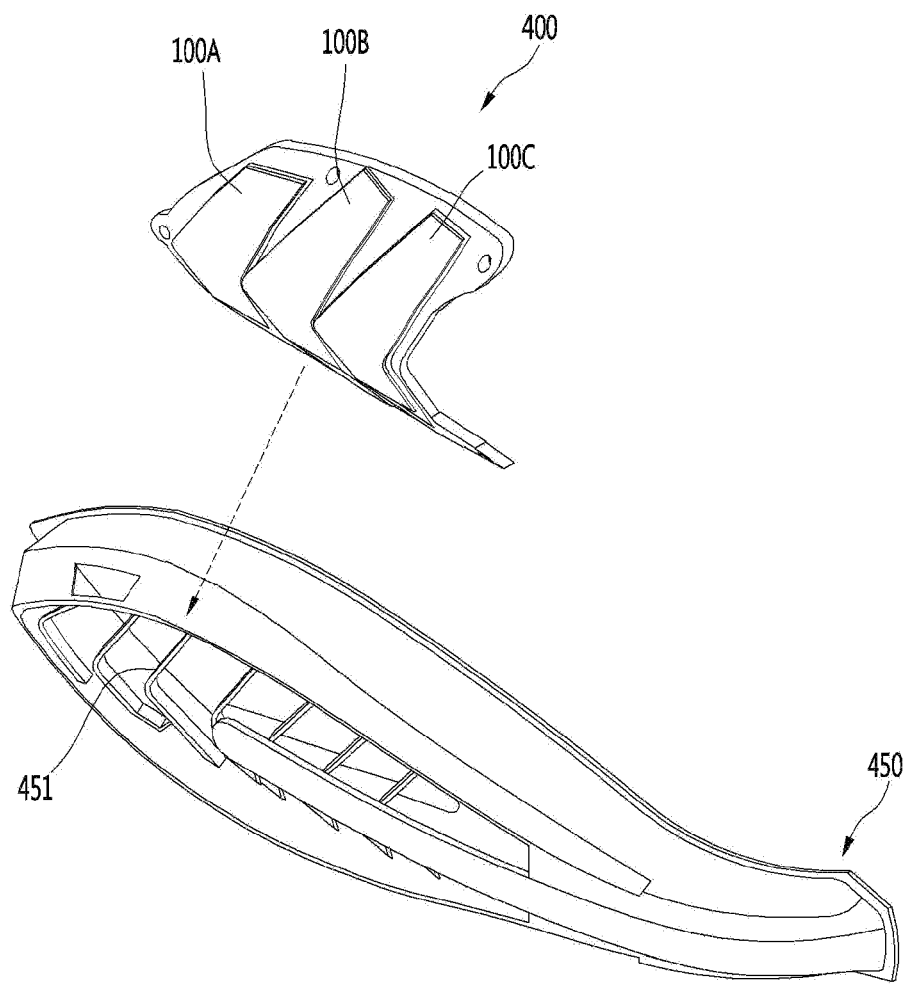
FIG. 18 is a perspective view before the combination of the lighting assembly and the main frame according to the fifth embodiment.
Figure 19:
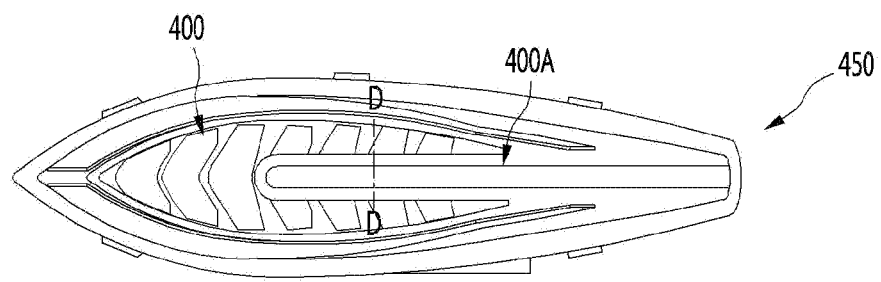
FIG. 19 is a side view of a combination of the lighting assembly of FIG. 18 and a main frame.
Figure 20:
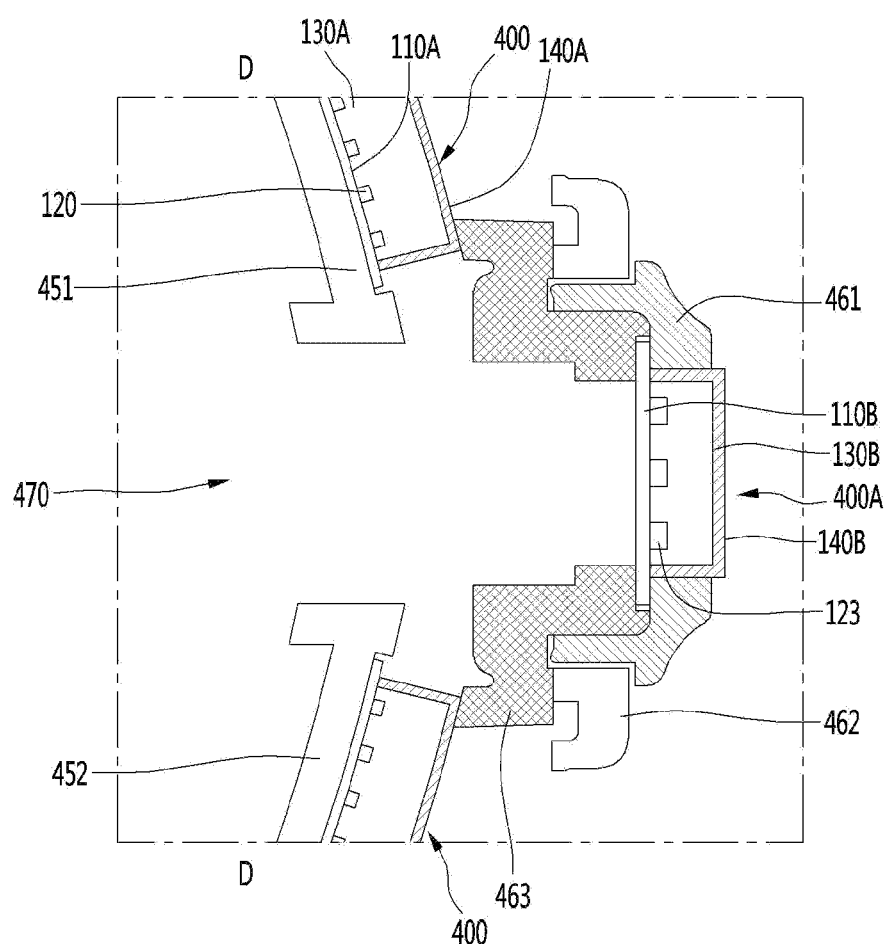
FIG. 20 is a cross-sectional view taken along line D-D of FIG. 19.

FIG. 16 is a plan view of a lighting assembly according to a fourth embodiment, FIG. 17 is an example of a side cross-sectional view of the lighting assembly of FIG. 16, FIG. 19 is a side view of a combination of the lighting assembly of FIG. 18 and a main frame, and FIG. 20 is a side cross-sectional view taken along line D-D of FIG. 19.

Referring to FIGS. 16 and 17, the lighting assembly 400 may include a plurality of lighting modules 100A, 100B, and 100C and a cover 410 in which the plurality of lighting modules 100A, 100B, and 100C are coupled. The substrate cover portion 411 of the cover 410 is disposed on the substrate 110 of each of the lighting modules 100A, 100B, and 100C, and the side cover portion 413 may extend from outside the side surface of the substrate 110 in a direction of the lower portion of the substrate 110. One or more locking protrusions 430 of the cover 410 protrude below the substrate 110 of the lighting modules 100A, 100B, and 100C, and a locking jaw may be formed at the lower end portion of the locking protrusions. The locking protrusion 430 may be hooked through the side surface of the substrate 110 or may protrude through the hole of the substrate 110. At this time, the cover 410 fixes and supports the substrate 110 of the lighting module 100A, 100B, and 100C by the locking protrusions 430, and the locking protrusion 430 protruding under the cover may be combined with another main case. The light emitting regions of the plurality of lighting modules 100A, 100B, and 100C may have the same shape, and may be coupled to the cover 410 having different sizes or different shapes. The second resin layer 140 of the lighting modules 100A, 100B, and 100C may protrude through the opening portion 415 of the cover 410. In this case, the substrate 110 of the lighting module 100 may be bonded to the cover 410 through thermal fusion, or may be fixed with an adhesive.

As shown in FIGS. 18 and 19, the lighting assemblies 400 and 400A may be inserted into the main case 450 and coupled to the main case 450. The light emitting regions of the lighting assemblies 400 and 400A may be respectively inserted and protruded into the opening portion 451 of the main case 450. As shown in FIGS. 19 and 20, a first lighting assembly 400 and a second lighting assembly 400A may be coupled to the main case 450 through a rear opening portion 470. The first and second lighting assemblies 400 and 400A may be supported and fixed by the covers 451, 452, 461, 462, and 463, and a light emitting region may be exposed. The first and second lighting assemblies 400 and 400A may be second resin layers 140A and 140B to which different phosphors are added to the second resin layers 140A and 140B. The first and second lighting assemblies 140 and 140B may include second resin layers 140A and 140B having ink particles of different colors. At least one or both of the second resin layers 140A and 140B may include phosphor and ink particles. As shown in FIGS. 18 and 19, since each substrate 110 of the lighting modules 100A, 100B, and 100C is exposed under the cover, power to the substrate 110 may be easily supplied. The above-described lighting assembly 400 and 400A is coupled with a plurality of lighting modules 100A, 100B, and 100C, so that the assembly having the lighting modules 100A, 100B, and 100C without using a separate fixture may be coupled to the main case. Such a lighting assembly may improve the assembling property or detachability to the main case. The lighting modules of the lighting assembly disclosed in the above embodiment(s) may each include the lighting modules disclosed in the first embodiment. The lighting assembly according to the above-described embodiment(s) may be coupled to a vehicle lamp. For example, when applied to a tail lamp, a brake lamp, or a turn signal lamp of a vehicle, it may be applied to a turn signal lamp of a vehicle.

Features, structures, effects, and the like described in the embodiments above are included in at least one embodiment of the invention, and are not necessarily limited to only one embodiment. Furthermore, the features, structures, effects, and the like illustrated in each embodiment may be combined or modified for other embodiments by a person having ordinary knowledge in the field to which the embodiments belong. Therefore, contents related to such combinations and modifications should be interpreted as being included in the scope of the invention.

What is claimed is:
1. A lighting assembly comprising:
   a lighting module including a substrate, a plurality of light emitting devices on the substrate, a first resin layer covering the plurality of light emitting devices, and at least one second resin layer on the first resin layer; and
   a first cover disposed on an outer portion of the substrate along an outer periphery of the substrate of the lighting module,
   wherein the second resin layer is disposed on an upper surface and side surfaces of the first resin layer,
   wherein the second resin layer includes at least one of wavelength conversion means and ink particles,
   wherein the first cover includes an opening portion from which the second resin layer protrudes, a substrate cover portion disposed on an outer portion of an upper surface of the substrate and around the opening portion, and a side cover portion extending lower than a side surface of the substrate from the substrate cover portion,
   wherein an upper surface of the substrate cover portion is disposed lower than the upper surface of the first resin layer,
   wherein an area of the upper surface of the substrate is greater than an area of a lower surface of the first resin layer, wherein the outer portion of the upper surface of the substrate extends further outward from an edge of the second resin layer, wherein an edge of the substrate extends more outward than a lower periphery of the second resin layer, and wherein a thickness of the lighting module is 5.5 mm or less.

2. The lighting assembly of claim 1, further comprising a second cover including a substrate support portion under the substrate of the lighting module and a stepped coupling portion around an outer periphery of the substrate support portion, wherein the side cover portion of the first cover is coupled to the coupling portion of the second cover.

3. The lighting assembly of claim 2, wherein the first cover and the second cover include a cable lead portion protruding outward from a region between the first and second covers and from which a power cable connected to the substrate is drawn out.

4. The lighting assembly of claim 2, wherein the second cover includes a terminal groove in which a terminal on a lower surface of the substrate is exposed, wherein a side surface of the terminal groove is inclined toward one side of the lighting module.

5. The lighting assembly of claim 1, wherein a distance between the side surface of the substrate and a side surface of the second resin layer is at least 0.1 times the thickness of the lighting module.

6. The lighting assembly of claim 1, wherein the upper surface of the substrate and an upper surface of the second resin layer comprise a convex curved surface.

7. The lighting assembly of claim 1, wherein the first cover includes a locking protrusion protruding toward the substrate.

8. The lighting assembly of claim 1, wherein the opening portion of the first cover is provided in plural, and wherein the lighting module is provided in plural and protruded from each of the opening portions.

9. The lighting assembly of claim 1, wherein each of the plurality of light emitting devices is disposed on the substrate in a flip chip type, wherein the second resin layer includes phosphor and ink particles in a resin material, wherein a content of the phosphor in the second resin layer is 23 wt % or less, and a content of the ink particles is in a range of 3 wt % to 13 wt %.

10. A lighting assembly comprising:

a lighting module including a substrate, a plurality of light emitting devices on the substrate, a first resin layer covering the plurality of light emitting devices, and at least one second resin layer on the first resin layer; and a cover including a first cover disposed on an outer periphery of the substrate of the lighting module and a second cover supporting a lower portion of the lighting module, wherein the second resin layer is disposed on a surface of the first resin layer and includes at least one of wavelength conversion means and ink particles therein, wherein the first cover includes an opening portion from which the first and second resin layers protrude, a substrate cover portion disposed on an outer portion of an upper surface of the substrate and around the opening portion, and a side cover portion extending from the substrate cover portion to a side surface of the substrate, wherein an area of the upper surface of the substrate is greater than an area of a lower surface of the first resin layer, wherein an edge the substrate extends further outward from a lower periphery of the second resin layer, and wherein the cover includes first and second coupling members concave toward the substrate on both sides adjacent to one end of the lighting module.

11. The lighting assembly of claim 10, wherein the second wherein a terminal disposed on a lower surface of the substrate is exposed through the terminal grooves.

12. The lighting assembly of claim 11, wherein the plurality of terminal grooves is disposed closer to one end of the lighting module than a virtual straight line connecting the first and second coupling members.

13. The lighting assembly of claim 11, wherein a side surface of the second resin layer comprises a convex curved surface.

14. The lighting assembly of claim 11, wherein a thickness of the lighting module is less than 5.5 mm, wherein each of the plurality of light emitting devices is disposed on the substrate in a flip chip type, wherein the second resin layer includes phosphor and ink particles in a resin material, wherein a content of the phosphor in the second resin layer is 23 wt % or less, and a content of the ink particles is in a range of 3 wt % to 13 wt %.

15. A lighting assembly comprising:

a lighting module including a substrate, a plurality of light emitting devices on the substrate, a first resin layer covering the plurality of light emitting devices, and at least one second resin layer on the first resin layer; and a first cover disposed on an outer portion of the substrate along an outer periphery of the substrate of the lighting module, wherein the second resin layer is disposed on an upper surface and side surfaces of the first resin layer, wherein the second resin layer includes at least one of wavelength conversion means and ink particles, wherein the first cover includes an opening portion from which the second resin layer protrudes, a substrate cover portion disposed at a periphery of the opening portion and on an outer periphery of an upper surface of the substrate, and a side cover portion extending lower than a side surface of the substrate from the substrate cover portion, wherein the upper surface of the substrate cover portion is disposed lower than the upper surface of the first resin layer, wherein an area of the upper surface of the substrate is greater than an area of a lower surface of the first resin layer, wherein an edge portion between an upper surface and a side surface of the second resin layer is formed in a curved surface, wherein the outer portion of the upper surface of the substrate extends further outward from an edge of the second resin layer, wherein a linear distance from a lower surface of the substrate to the upper surface of the second resin layer is 5.5 mm or less, wherein a thickness of the lighting module is in a range of 180% to 220% of a thickness of the first resin layer, and wherein a length of the outer portion of the upper surface of the substrate is a distance from the side surface of the second resin layer to an edge of the substrate, and is in a range of 0.3 mm to 1 mm.

16. The lighting assembly of claim 15, wherein a height of the upper surface of the substrate cover portion is less than ½ of a height of the upper surface of the second resin layer, and wherein a corner portion between adjacent side surfaces of the lighting module is formed in a curved surface.

17. The lighting assembly of claim 15, further comprising a second cover including a substrate support portion under the substrate of the lighting module and a stepped coupling portion around an outer periphery of the substrate support portion, wherein the side cover portion of the first cover is coupled to the coupling portion of the second cover.

18. The lighting assembly of claim 17, wherein the second cover includes a terminal groove in which a terminal on the lower surface of the substrate is exposed, wherein a side surface of the terminal groove is inclined toward one side of the lighting module.

19. The lighting assembly of claim 15, wherein the second resin layer comprises a phosphor and ink particles in a resin material, wherein the first resin layer is formed as a light-transmitting layer that does not contain impurities, wherein a content of the phosphor in the second resin layer is 23 wt % or less, and a content of the ink particles is in a range of 3 wt % to 13 wt %.

* * * * *